(12) United States Patent
Wysocki

(10) Patent No.: US 11,012,059 B2
(45) Date of Patent: May 18, 2021

(54) CLOCK RECOVERY BASED ON DIGITAL SIGNALS

(71) Applicant: SONY CORPORATION, Tokyo (JP)

(72) Inventor: Jacob Adams Wysocki, Santa Cruz, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/856,584

(22) Filed: Apr. 23, 2020

(65) Prior Publication Data

US 2020/0358432 A1   Nov. 12, 2020

Related U.S. Application Data

(60) Provisional application No. 62/844,824, filed on May 8, 2019.

(51) Int. Cl.
| | |
|---|---|
| *H03K 5/135* | (2006.01) |
| *H04L 7/033* | (2006.01) |
| *H03K 3/017* | (2006.01) |
| *H03K 5/134* | (2014.01) |
| *H03H 7/32* | (2006.01) |

(Continued)

(52) U.S. Cl.
CPC .......... *H03K 5/135* (2013.01); *H03H 7/325* (2013.01); *H03K 5/134* (2014.07); *H03K 19/01721* (2013.01); *H04L 7/033* (2013.01); *H03K 2005/00071* (2013.01)

(58) Field of Classification Search
None
See application file for complete search history.

(56) References Cited

U.S. PATENT DOCUMENTS 5,736,872 A * 4/1998 Sharma ............... H03D 13/004
                                                                327/12
9,735,950 B1    8/2017 Liu et al.
(Continued)

FOREIGN PATENT DOCUMENTS

| CN | 107959563 A | 4/2018 |
|---|---|---|
| CN | 108121619 A | 6/2018 |

(Continued)

OTHER PUBLICATIONS

Jalali, et al., "A Reference-Less Single-Loop Half-Rate Binary CDR", IEEE Journal of Solid-State Circuits, vol. 50, No. 9, Sep. 2015, pp. 2037-2047.

(Continued)

*Primary Examiner* — An T Luu
(74) *Attorney, Agent, or Firm* — Chip Law Group

(57) ABSTRACT

A clock recovery circuit includes a first pulse circuit, a second pulse circuit, a state change circuit connected to the first pulse circuit and the second pulse circuit and a first delay circuit connected to the state change circuit and each of the first pulse circuit and the second pulse circuit. The first pulse circuit receives data inputs to generate a first pulse signal. The second pulse circuit receives the data inputs to generate a second pulse signal. The state change circuit receives the first pulse signal and the second pulse signal and generate a first clock signal for a first transition of one of the data inputs in a first unit interval (UI). The first delay circuit receives the generated first clock signal and mask other transitions of the data inputs in the first UI.

21 Claims, 10 Drawing Sheets

(51) Int. Cl.
*H03K 19/017* (2006.01)
*H03K 5/00* (2006.01)

(56) References Cited

U.S. PATENT DOCUMENTS

| | | | |
|---|---|---|---|
| 9,774,319 B2* | 9/2017 | Park | H03K 5/24 |
| 2005/0007168 A1* | 1/2005 | Park | H03K 5/1565 |
| | | | 327/175 |
| 2018/0152282 A1 | 5/2018 | Choi et al. | |

FOREIGN PATENT DOCUMENTS

| | | |
|---|---|---|
| KR | 10-2018-0016560 A | 6/2018 |
| TW | 201818669 A | 5/2018 |
| WO | 2018/089673 A1 | 5/2018 |

OTHER PUBLICATIONS

International Search Report and Written Opinion of PCT Application No. PCT/IB2020/054234, dated Jul. 22, 2020, 14 pages of ISRWO.

* cited by examiner

CLOCK RECOVERY BASED ON DIGITAL SIGNALS

CROSS-REFERENCE TO RELATED APPLICATIONS/INCORPORATION BY REFERENCE

This application claims priority to U.S. Provisional Patent Application Ser. No. 62/844,824 filed on May 8, 2019, the entire content of which is hereby incorporated herein by reference.

FIELD

Various embodiments of the disclosure relate to clock recovery circuits. More specifically, various embodiments of the disclosure relate to clock recovery circuits based on data signals transitions.

BACKGROUND

Advancements in the field of analog and digital circuits have increased the utilization of clock recovery circuits in different applications. Typically, in digital communication related circuits, transmitted signals need to be recovered at a receiving end to accurately decode information embedded in the transmitted signals. Such recovery of the transmitted signals may be done based on the clock recovery circuits. In certain situations, due to transitions of multiple digital signals in a particular unit interval, the conventional clock recovery circuits may not be effective to timely generate a clock signal for accurate recovering of the information embedded in the transmitted signals.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

A circuit for clock recovery based on digital signals is provided substantially as shown in, and/or described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

The following described implementations may be found in a disclosed clock recovery circuit to recover timing information from a plurality of data signals at a first transition in a unit interval (UI). Exemplary aspects of the disclosure provide a clock recovery circuit. The clock recovery circuit may include a first pulse circuit (for example a pullup generator circuit) configured to receive a plurality of data inputs to generate a first pulse signal. The clock recovery circuit may further include a second pulse circuit (for example a pulldown pulse generator circuit) configured to receive the plurality of data inputs to generate a second pulse signal. The clock generator circuit further may include a state change circuit connected to the first pulse circuit and the second pulse circuit. The state change circuit may be configured to generate a first clock signal for a first transition of one of the plurality of data inputs in a first unit interval (UI), based on the generated first pulse signal and the second pulse signal. The generated first clock signal may correspond to timing information to sample the plurality of data inputs at a communication device where the plurality of data inputs may be received. The clock recovery circuit may further include a first delay circuit connected to the state change circuit and each of the first pulse circuit and the second pulse circuit. The first delay circuit may be configured to receive the generated first clock signal from the state change circuit and mask (or ignore) other transitions (i.e. different from the first transition) of the plurality of data inputs in the first UI. The clock recovery circuit may be configured to identify a foremost transition in each UI and generate the first clock signal based on the identified foremost transition of one of the plurality of data inputs. The generated first clock signal may be used to effectively recover or sample digital signals received in a particular UI. Moreover, the clock recovery circuit may activate and/or deactivate any one of the first pulse circuit or the second pulse circuit during the particular UI and delay the generated first clock signal during the unit interval (UI) to mask other transitions than the foremost transitions of the plurality of data inputs in the UI. The masking of the other transitions may enable the first clock signal to transition only once in one UI, thereby, provide generation of effective first clock signal that may indicate the timing information to sample or recover the plurality of data inputs (such as the digital information) received by the first pulse circuit and the second pulse circuit. In accordance with an embodiment, the clock recovery circuit may generate the first clock signal as a half-rate clock which may enable decoding of the information related to the digital signal at lesser speed and/or with lesser power consumption, as compared to conventional full-rate clock recovery circuits.

Figure 1:
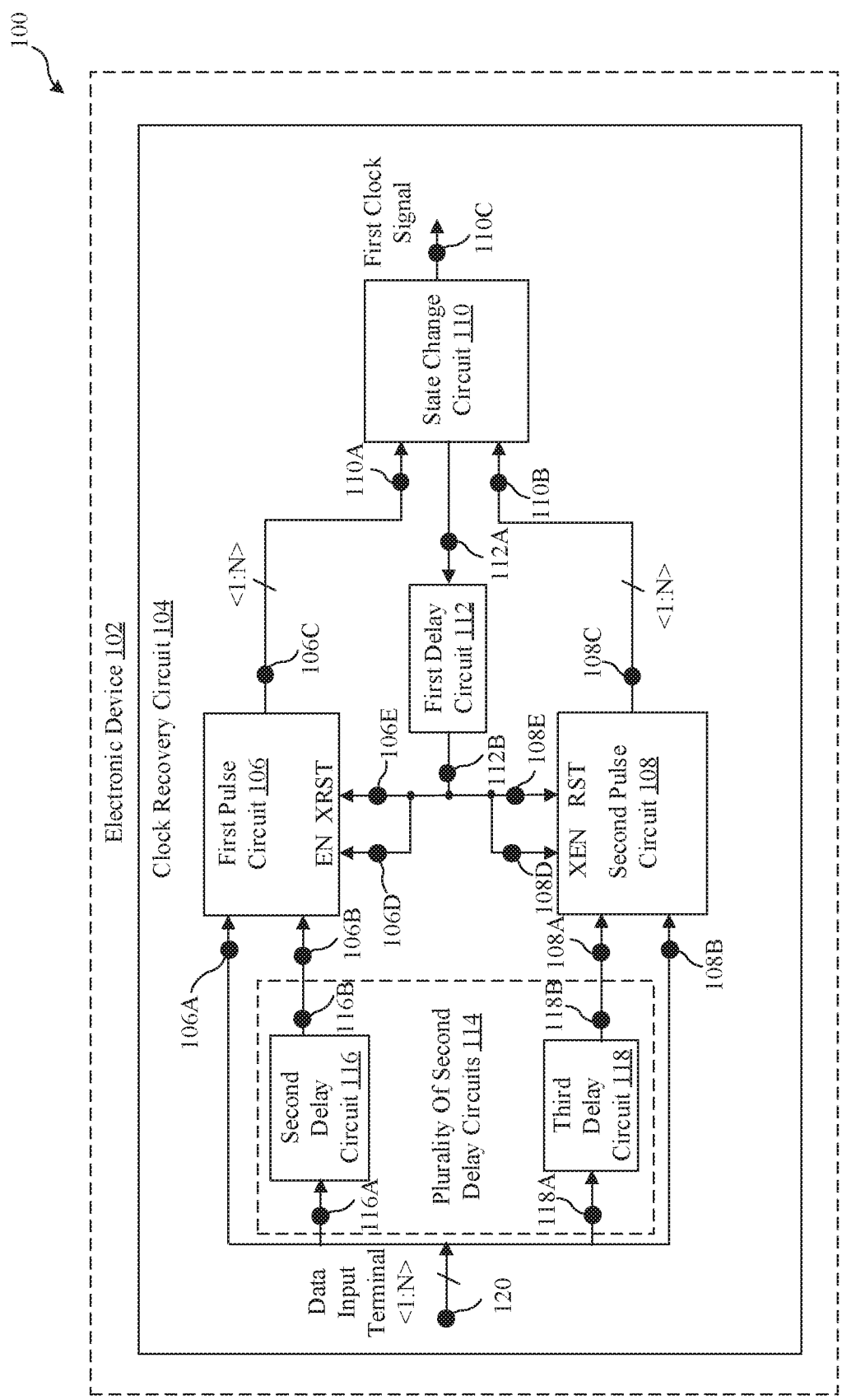
FIG. 1 is a schematic diagram of an exemplary electronic device including a clock recovery circuit, in accordance with an embodiment of the disclosure.

FIG. 1 is a first schematic diagram of an exemplary electronic device including a clock recovery circuit, in accordance with an embodiment of the disclosure. With reference to FIG. 1, there is shown an electronic device 102. The electronic device 102 may include a clock recovery circuit 104. The clock recovery circuit 104 may further include a first pulse circuit 106 and a second pulse circuit 108. The clock recovery circuit 104 may further include a state change circuit 110, a first delay circuit 112, and a plurality of second delay circuits 114. The plurality of second delay circuits 114 may include a second delay circuit 116 and a third delay circuit 118.

The first pulse circuit 106 may include a first input terminal 106A, a second input terminal 106B, and an output terminal 106C, as shown in FIG. 1. The first pulse circuit 106 may further include an enable switch terminal 106D (also represented as "EN" in FIG. 1) and a complimentary reset switch terminal 106E (also represented as "XRST" in FIG. 1). The second pulse circuit 108 may include a first input terminal 108A, a second input terminal 108B, and an output terminal 108C, as shown in FIG. 1. The second pulse circuit 108 may further include a complementary enable switch terminal 108D (also represented as "XEN" in FIG. 1) and a reset switch terminal 108E (also represented as "RST" in FIG. 1). The state change circuit 110 may include a first input terminal 110A, a second input terminal 110B, and an output terminal 110C, as shown in FIG. 1. The first delay circuit 112 may include an input terminal 112A and an output terminal 112B. The second delay circuit 116 may include an input terminal 116A and an output terminal 116B, and the third delay circuit 118 may include an input terminal 118A and an output terminal 118B. The clock recovery circuit 104 may further include a data input terminal 120, as shown in FIG. 1.

The data input terminal 120 may be connected to the first input terminal 106A of the first pulse circuit 106 and to the input terminal 116A of the second delay circuit 116 as shown in FIG. 1. The data input terminal 120 may be further connected to the second input terminal 108B of the second pulse circuit 108 and connected to the input terminal 118A of the third delay circuit 118 as shown in FIG. 1. The output terminal 116B of the second delay circuit 116 may be connected to the second input terminal 106B of the first pulse circuit 106, and the output terminal 118B of the third delay circuit 118 may be connected to the first input terminal 108A of the second pulse circuit 108 as shown in FIG. 1.

The output terminal 106C of the first pulse circuit 106 may be connected to the first input terminal 110A of the state change circuit 110. The output terminal 108C of the second pulse circuit 108 may be connected to the second input terminal 110B of the state change circuit 110, as shown in FIG. 1. A first clock signal may be obtained via the output terminal 110C of the state change circuit 110. The obtained first clock signal may be fed as an input to the input terminal 112A of the first delay circuit 112. The output terminal 112B of the first delay circuit 112 may be further connected to the enable switch terminal 106D of the first pulse circuit 106 and the complimentary reset switch terminal 106E of the first pulse circuit 106, as shown in FIG. 1. The output terminal 112B of the first delay circuit 112 may further be connected to the complementary enable switch terminal 108D of the second pulse circuit 108 and the reset switch terminal 108E of the second pulse circuit 108, as shown in FIG. 1.

The electronic device 102 may include suitable logic, circuitry, and interfaces that may be configured to include the clock recovery circuit 104. The electronic device 102 may be configured to receive the plurality of data inputs, via the data input terminal 120. The electronic device 102 may be configured to generate the first clock signal to recover or sample the received plurality of data inputs. The first clock signal may be generated or recovered at a foremost transition (i.e. first transition) of the plurality of data inputs in a unit interval (UI), to determine the timing information that may indicate a time to sample the plurality of data inputs in the UI. Examples of the electronic device 102 may include, but are not limited to, an imaging device, a communication device, an electronic transmitter or receiver device, a computing device, a smartphone, a cellular phone, a mobile phone, a gaming device, an image capturing device, a mainframe machine, a server, a computer work-station, and/or a consumer electronic (CE) device.

The clock recovery circuit 104 may include suitable logic, circuitry and interfaces that may be configured to receive and/or decode the plurality of data inputs (say received in a digital form). The clock recovery circuit 104 may be configured to generate the first clock signal that may indicate the timing information to recover the plurality of data inputs received by the clock recovery circuit 104. In some embodiment, the clock recovery circuit 104 may be further configured to generate the half-rate clock as the first clock signal to recover the timing information associated with the plurality of data inputs in every UI.

The first pulse circuit 106 may include suitable logic, circuitry and interfaces that may be configured to generate a first pulse signal (such as a rectangular pulse) based on the received plurality of data inputs. The generated first pulse signal may drive logic circuits, such as the state change circuit 110. In an example, the first pulse circuit 106 may include a pullup pulse generator circuit. The first pulse circuit 106 is described, for example, in FIG. 2A.

The second pulse circuit 108 may include suitable logic, circuitry and interfaces that may be configured to generate a second pulse signal (such as a rectangular pulse) based on the received plurality of data inputs. The generated second pulse signal may drive logic circuits, such as the state change circuit 110. In an example, the second pulse circuit 108 may include a pulldown pulse generator circuit. The second pulse circuit 108 is described, for example, in FIG. 2B.

The state change circuit 110 may include suitable logic, circuitry and interfaces that may be configured to output the first clock signal, via the output terminal 110C of the state change circuit 110, based on the generated first pulse signal and the second pulse signal. The first clock signal may correspond to the timing information of the plurality of data inputs received by the first pulse circuit 106 and the second pulse circuit 108 via the data input terminal 120. In an embodiment, the state change circuit 110 may be configured to hold the generated first clock signal for a particular UI. The state change circuit 110 is described, for example, in FIG. 3.

The first delay circuit 112 may include suitable logic, circuitry and interfaces that may be configured to provide a controlled delay to the first clock signal (or the complementary of the first clock signal) fed as input to the first delay circuit 112 from the state change circuit 110. The delayed first clock signal (or complementary version) may be fed to the enable switch terminal 106D of the first pulse circuit 106, the complimentary reset switch terminal 106E of the first pulse circuit 106, the complementary enable switch terminal 108D of the second pulse circuit 108, and the reset switch terminal 108E of the second pulse circuit 108, as shown in FIG. 1. The first delay circuit 112 is described, for example, in FIGS. 4A, 4B, 6, 7, and 8.

The plurality of second delay circuits 114 may include suitable logic, circuitry and interfaces that may be configured to provide uncontrolled delay to the plurality of data inputs received from the data input terminal 120. The plurality of data inputs with the uncontrolled delay may be provided to the first pulse circuit 106 and the second pulse circuit 108, via the output terminal 116B of the second delay circuit 116 and the output terminal 118B of the third delay circuit 118, respectively. The plurality of second delay circuits 114 may provide delayed version of the plurality of data inputs such that the first pulse circuit 106 and the second pulse circuit 108 may perform exclusive-OR or exclusive-NOR operation between the plurality of data inputs and the complementary data of the plurality of data inputs.

In accordance with an embodiment, the clock recovery circuit 104 may receive the plurality of data inputs, through the data input terminal 120. The data input terminal 120 shown as a single input terminal in FIG. 1, is presented merely as an example. The data input terminal 120 may include a plurality of terminals or data lines which may receive the plurality of data inputs. Similarly, the connections between the data input terminal 120, the first pulse circuit 106, the second pulse circuit 108, the second delay circuit 116, the third delay circuit 118, and the state change circuit 110 may include a plurality of connections corresponding to each of the plurality of data inputs. It may be further noted that the plurality of data inputs referred in FIG. 1 is presented merely as an example. However, the data input terminal 120 may receive a plurality of address lines based on which the clock recovery circuit 104 may generate the first clock signal. Therefore, the plurality of data inputs may correspond to a data bus or an address bus.

In operation, the first pulse circuit 106 may be configured to receive the plurality of data inputs from the data input terminal 120 of the clock recovery circuit 104 to generate the first pulse signal. In an example, "N" number of the plurality of data inputs may be received from the data input terminal 120. For example, the number of plurality of data inputs may be two, three or eight based on a size of the data bus of the electronic device 102. The first pulse signal generated by the first pulse circuit 106 may be, for example, a rectangular pulse, where a time period of the first pulse signal may either constant or varying. In accordance with an embodiment, the second pulse circuit 108 may be configured to receive the plurality of data inputs from the data input terminal 120 of the clock recovery circuit 104 to generate the second pulse signal. The second pulse signal may be, for example, the rectangular pulse, where a time period of the second pulse signal may either be constant or varying.

In an exemplary embodiment, the first pulse circuit 106 and the second pulse circuit 108 may be configured to receive the plurality of data inputs, via the plurality of second delay circuits 114, such as the second delay circuit 116 and the third delay circuit 118. In accordance with an embodiment, the state change circuit 110 may be configured to receive the first pulse signal from the first pulse circuit 106. via the first input terminal 110A of the state change circuit 110, and receive the second pulse signal from the second pulse circuit 108, via the second input terminal 110B of the state change circuit 110. The state change circuit 110 may further be configured to generate the first clock signal (i.e. output via the output terminal 110C of the state change circuit 110) for a first transition of one of the plurality of data inputs in the first UI, based on the generated first pulse signal and the second pulse signal. The UI may refer to a predefined interval of time taken in a data stream by each pulse. It may be referred as a pulse time. In an embodiment, in one UI, each data signal of the plurality of data signals may have a maximum of one transition. In some embodiments, transitions of the plurality of data inputs may be separated in time in each UI. The transition may either be a change of state of a data signal to a high-level logic from a low-level logic as compared to a reference logic, or a change of state of the data signal to the low-level logic from the high-level logic as compared to the reference logic. The first transition of one of the plurality of inputs in the first UI is described, for example, in FIG. 5. In accordance with an embodiment, the first delay circuit 112 may be configured to receive the first clock signal from the state change circuit 110 via the input terminal 112A of the first delay circuit 112, and configured to generate the delayed first clock signal to mask other transitions, different from the first transition, of the plurality of data inputs in the first UI. The first delay circuit 112 may be configured to control the first pulse circuit 106 and the second pulse circuit 108 to mask the other transitions in the UI as described, for example, in FIGS. 4B, 5, 6, and 7.

Figure 2A:
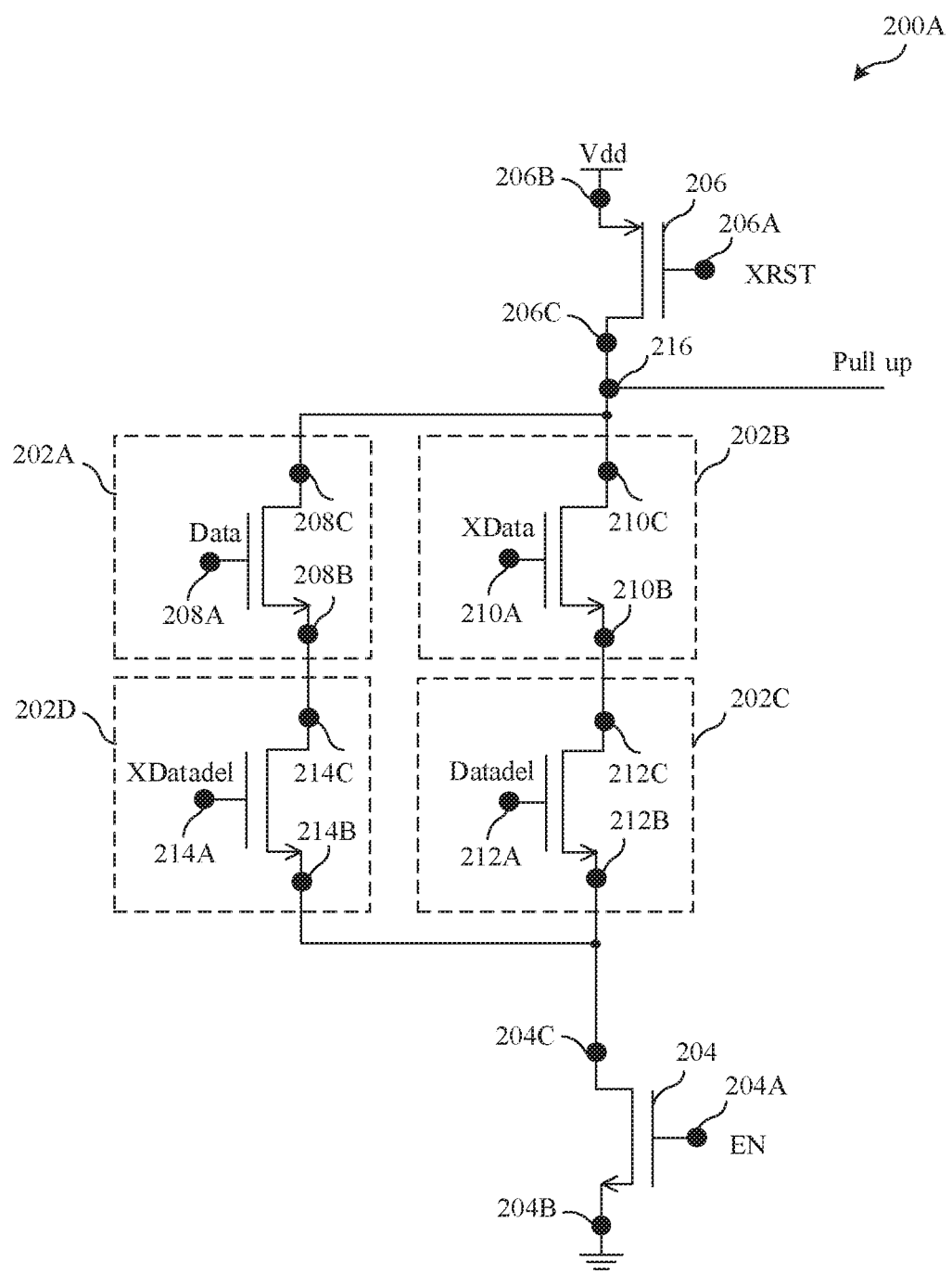
FIG. 2A is a schematic diagram of an exemplary first pulse circuit of the clock recovery circuit of FIG. 1, in accordance with an embodiment of the disclosure.

FIG. 2A is a schematic diagram of an exemplary first pulse circuit of FIG. 1, in accordance with an embodiment of the disclosure. FIG. 2A is explained in conjunction with elements from FIG. 1. With reference to FIG. 2A, there is shown a first pulse circuit 200A (i.e. similar to the first pulse circuit 106 of FIG. 1). In accordance with an embodiment, the first pulse circuit 200A may be a pullup pulse generator circuit. The first pulse circuit 200A may include a plurality of edge detection switches 202A-202D, which may further include a first edge detection switch 202A, a second edge detection switch 202B, a third edge detection switch 202C, and a fourth edge detection switch 202D. In accordance with an embodiment, each of the plurality of edge detection switches 202A-202D may correspond to a N-type Metal-Oxide Semiconductor field-effect-transistor (NMOS). Furthermore, the first pulse circuit 200A may include an enable switch 204 and a complimentary reset switch 206, as shown in FIG. 2A. In an embodiment, the enable switch 204 may include the NMOS, whereas the complimentary reset switch 222 may include the P-type MOSFET (PMOS), as shown in FIG. 2A.

The first edge detection switch 202A may include a first gate terminal 208A, a first source terminal 208B, and a first drain terminal 208C. The second edge detection switch 202B may include a second gate terminal 210A, a second source terminal 210B, and a second drain terminal 210C. The third edge detection switch 202C may include a third gate terminal 212A, a third source terminal 212B, and a third drain terminal 212C. The fourth edge detection switch 202D may include a fourth gate terminal 214A, a fourth source terminal 214B, and a fourth drain terminal 214C. The enable switch 204 may include a fifth gate terminal 204A, a fifth source terminal 204B and a fifth drain terminal 204C. The complimentary reset switch 206 may include a sixth gate terminal 206A, a sixth source terminal 206B, and a sixth drain terminal 206C. The first pulse circuit 200A may further include an output terminal 216, similar to the output terminal 106C of the first pulse circuit 106 shown in FIG. 1.

As shown in FIG. 2A, the first drain terminal 208C of the first edge detection switch 202A may be connected to the second drain terminal 210C of the second edge detection switch 202B. The fourth source terminal 214B of the fourth edge detection switch 202D may be connected to the third source terminal 212B of the third edge detection switch 202C. Furthermore, the first source terminal 208B of the first edge detection switch 202A may be connected to the fourth drain terminal 214C of the fourth edge detection switch 202D. Moreover, the second source terminal 210B of the second edge detection switch 202B may be connected to the third drain terminal 212C of the third edge detection switch 202C, as shown in FIG. 2A. The sixth drain terminal 206C of the complimentary reset switch 206 may be connected to the first drain terminal 208C and the second drain terminal 210C. Further, the fifth drain terminal 204C of the enable switch 204 may be connected to the fourth source terminal 214B and the third source terminal 212B, as shown in FIG. 2A.

The first pulse circuit 200A may receive one of the plurality of data inputs (for example "Data" shown in FIG. 2A) via the first gate terminal 208A of the first edge detection switch 202A. The first gate terminal 208A may correspond to the first input terminal 106A of the first pulse circuit 106 shown in FIG. 1. A complimentary input of the one of the plurality of data inputs (for example "XData" shown in FIG. 2A) may be received by the second gate terminal 210A of the second edge detection switch 202B. Moreover, the delayed one input of the plurality of data inputs (for example "Datadel" in FIG. 2A) may be received by the third gate terminal 212A of the third edge detection switch 202C from the second delay circuit 116. The third gate terminal 212A may be the second input terminal 106B of the first pulse circuit 106 as shown in FIG. 1. A delayed complimentary input of the one of the plurality of data inputs (for example "XDatadel" in FIG. 2A) may be received by the fourth gate terminal 214A of the fourth edge detection switch 202D of the first pulse circuit 106. In accordance with an embodiment, the plurality of edge detection switches 202A-202D of the first pulse circuit 200A may be configured to implement the Exclusive OR (EXOR) function or Exclusive NOR (EX-NOR) function based on the connection of the first edge detection switch 202A, the second edge detection switch 202B, the third edge detection switch 202C, and the fourth edge detection switch 202D as shown in FIG. 2A. The enable switch 204 of the first pulse circuit 200A may be configured to receive the delayed first clock signal (as a control signal EN) from the state change circuit 110 via the fifth gate terminal 204A of the enable switch 204. As shown in FIG. 2A, the fifth source terminal 204B of the enable switch 204 may be grounded (for example connected to a 0-volt voltage source). The complimentary reset switch 206 may be configured to receive a complimentary input of the delayed first clock signal (as a control signal XRST) via the sixth gate terminal 206A of the complimentary reset switch 206. As shown in FIG. 2A, the sixth source terminal 206B of the complimentary reset switch 206 may be connected to a reference voltage source (as referred as "Vdd") of the first pulse circuit 200A.

The first pulse circuit 200A may be configured to receive the generated first clock signal from the state change circuit 110, such as via the enable switch 204 and the complementary reset switch 206. For example, when the first clock signal is at the high-level logic (such as "1"), the enable switch 204 (i.e. NMOS) may receive the input "EN" as "1" and the complementary reset switch 206 (PMOS) may receive the input "XRST" as "0" (i.e. complement of "1") as control signals. Accordingly, the enable switch 204 and the complementary reset switch 206 may be activated or turned-on which may further activate the first pulse circuit 200A to generate or fire the first pulse signal (as a pullup pulse). Moreover, the output (i.e., the first pulse signal) of the first pulse circuit 200A may be received from the output terminal 216 that may be connected to the sixth drain terminal 206C of the complementary reset switch 206 and the second drain terminal 210C of the second edge detection switch 202B.

It may be noted that the first pulse circuit 200A in FIG. 2A is shown for one data input. The disclosed clock recovery circuit 104 may include N number of first pulse circuits to receive N number of data inputs (i.e. the plurality of data inputs), where each first pulse circuit 200A of the N number of first pulse circuits may perform EX-NOR operation with the corresponding data input.

Examples of different values of data input and output of the first pulse circuit 200A, to indicate the operation of the first pulse circuit 200A, are presented in Table 1, as follows:

TABLE 1

Exemplary operation for the first pulse circuit

| Data Input and Delayed Data Input | | | | Control Signals | | Plurality Of Edge Detection Switches 202A-202D (NMOS) Of First Pulse Circuit | | | | Output |
|---|---|---|---|---|---|---|---|---|---|---|
| Data | Datadel | XData | XDatadel | EN | XRST | 202A | 202B | 202C | 202D | |
| 1 | 0 | 0 | 1 | 1 | 0 | ON | OFF | OFF | ON | 0 |
| 0 | 1 | 1 | 0 | 1 | 0 | OFF | ON | ON | OFF | 0 |
| 1 | 1 | 0 | 0 | 1 | 0 | ON | OFF | ON | OFF | 1 |
| 0 | 0 | 1 | 1 | 1 | 0 | OFF | ON | OFF | ON | 1 |
| Any | | | | 0 | 1 | First pulse circuit deactivated | | | | |

In an exemplary embodiment, the first clock signal received by the first pulse circuit 200A may be at the high-level logic, (i.e., "1") to activate the enable switch 204 and the complementary reset switch 206 using the control signals (i.e. EN and XRST). In a first instance, the data input ("Data") received by the first edge detection switch 202A may be "1", and the delayed data input ("Datadel") received by the third edge detection 202C switch may be "0" as shown in a first row of Table 1. Thus, the complementary data input ("XData") received by the second edge detection switch 202B may be "0" and the delayed complementary data input ("XDataDel") received by the fourth edge detection switch 202D may be "1". Thus, the first edge detection switch 202A (i.e. NMOS) and the fourth edge detection switch 202D (i.e. NMOS) may be in "ON" state, whereas the second edge detection switch 202B (i.e. NMOS) and the third edge detection switch 202C (i.e. NMOS) may be in "OFF" state, as shown in the first row of Table 1. As the first pulse circuit 200A may implement an Exclusive-NOR (EX-NOR) operation, the output (i.e. first pulse signal) collected from the output terminal 216 may be "0" (i.e. when Data is "1" and Datadel is "0") as shown in the first row of Table 1. Similarly, for Data as "0" and Datadel as "1", the output of the first pulse circuit 200A is "0" as shown in a second row of Table 1. Further, for Data as "1" and Datadel as "1", the output of the first pulse circuit 200A is "1" as shown in a third row of Table 1. Similarly, for Data as "0" and Datadel as "0", the output of the first pulse circuit 200A is "1" as shown in a fourth row of Table 1. Further, in case the control signals EN and XRST are "0" and "1" respectively (as shown in a fifth row of Table 1), the enable switch 204 (i.e. NMOS) and the complementary reset switch 206 (i.e. PMOS) of the first pulse circuit 200A may be disabled, to further deactivate the first pulse circuit 200A to restrict the generation of the first pulse signal (i.e. pullup pulse).

Figure 2B:
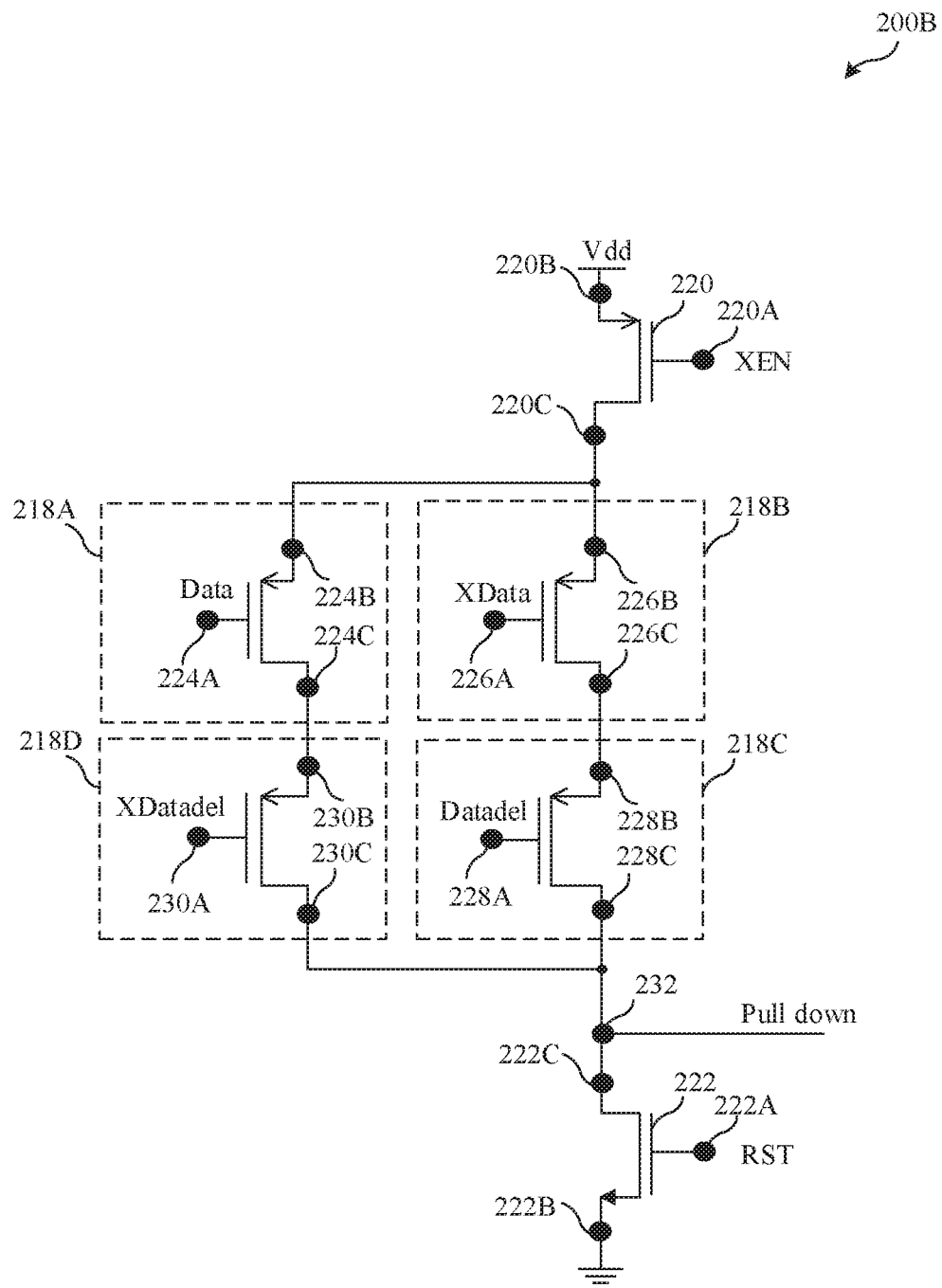
FIG. 2B is a schematic diagram of an exemplary second pulse circuit of the clock recovery circuit of FIG. 1, in accordance with an embodiment of the disclosure.

FIG. 2B is a schematic diagram of an exemplary second pulse circuit of the clock recovery circuit of FIG. 1, in accordance with an embodiment of the disclosure. FIG. 2B is explained in conjunction with elements from FIG. 1. With reference to FIG. 2B, there is shown a second pulse circuit 200B, similar to the second pulse circuit 108 of FIG. 1. In accordance with an embodiment, the second pulse circuit 200B may be a pulldown pulse generator circuit. The second pulse circuit 200B may include a plurality of edge detection switches 218A-218D, which may further include a first edge detection switch 218A, a second edge detection switch 218B, a third edge detection switch 218C, and a fourth edge detection switch 218D. In accordance with an embodiment, each of the plurality of edge detection switches 218A-218D may correspond to a P-type Metal-oxide semiconductor field-effect-transistor (PMOS). Furthermore, the second pulse circuit 200B may include a complimentary enable switch 220 and a reset switch 222, as shown in FIG. 2B. In an embodiment, the complimentary enable switch 220 may include a P-type MOS (PMOS) and the reset switch 222 may include a N-type MOS (i.e. NMOS), as shown in FIG. 2B.

The first edge detection switch 218A may include a first gate terminal 224A, a first source terminal 224B, and a first drain terminal 224C. The second edge detection switch 218B may include a second gate terminal 226A, a second source terminal 226B, and a second drain terminal 226C. The third edge detection switch 218C may include a third gate terminal 228A, a third source terminal 228B, and a third drain terminal 228C. The fourth edge detection switch 218D may include a fourth gate terminal 230A, a fourth source terminal 230B, and a fourth drain terminal 230C, as shown in FIG. 2B. The complimentary enable switch 220 may include a fifth gate terminal 220A, a fifth source terminal 220B, and a fifth drain terminal 220C. The reset switch 222 may include a sixth gate terminal 222A, a sixth source terminal 222B, and a sixth drain terminal 222C. The second pulse circuit 200B may further include an output terminal 232, similar to the output terminal 108C of the second pulse circuit 108 shown in FIG. 1.

As shown in FIG. 2B, the first source terminal 224B of the first edge detection switch 218A may be connected to the second source terminal 226B of the second edge detection switch 218B. The fourth drain terminal 230C of the fourth edge detection switch 218D may be connected to the third drain terminal 228C of the third edge detection switch 218C. Furthermore, the first drain terminal 224C of the first edge detection switch 218A may be connected to the fourth source terminal 23B of the fourth edge detection switch 218D. Moreover, the second drain terminal 226C of the second edge detection switch 218B may be connected to the third source terminal 228B of the third edge detection switch 218C. Further, as shown in FIG. 2B, the fifth drain terminal 220C of the complimentary enable switch 220 may be connected to the first source terminal 224B of the first edge detection switch 218A and the second source terminal 226B of the second edge detection switch 218B. The sixth drain terminal 222C of the reset switch 222 may be connected to the fourth drain terminal 230C of the fourth edge detection switch 218D and the third drain terminal 228C of the third edge detection switch 218C.

The second pulse circuit 200B may receive one of the plurality of data inputs (for example "Data" shown in FIG. 2B) via the first gate terminal 224A of the first edge detection switch 218A. The first gate terminal 224A may be the second input terminal 108B of the second pulse circuit 108 shown in FIG. 1. A complimentary input of the one of the plurality of data inputs (for example "XData" shown in FIG. 2B) may be received by the second gate terminal 226A of the second edge detection switch 218B. Moreover, the delayed one input of the plurality of data inputs (for example "Datadel" in FIG. 2B) may be received by the third gate terminal 228A of the third edge detection switch 218C from the third delay circuit 118. The third gate terminal 228A may be the first input terminal 108A of the second pulse circuit 108 as shown in FIG. 1. A delayed complementary input of one of the plurality of data inputs (for example "XDatadel" in FIG. 2B) may be received by the fourth gate terminal 230A of the fourth edge detection switch 218D as shown in FIG. 2B. In accordance with an embodiment, the four edge detection switches 218A-218D of the second pulse circuit 200B may be configured to implement an Exclusive OR (EX-OR) function or Exclusive NOR (EX-NOR) function based on the connection of the first edge detection switch 218A, the second edge detection switch 218B, the third edge detection switch 218C, and the fourth edge detection switch 218D of the second pulse circuit 200B, as shown in FIG. 2B. The complimentary enable switch 220 of the second pulse circuit 200B may be configured to receive the delayed first clock signal (as a control signal XEN) from the state change circuit 110 via the fifth gate terminal 220A of the complimentary enable switch 220. The fifth source terminal 220B may be connected to a voltage source (as referred as "Vdd") of the second pulse circuit 220B. The reset switch 222 may be configured to receive the input of the delayed first clock signal (as a control signal RST) via the sixth gate terminal 222A of the reset switch 222. The sixth source terminal 222B of the reset switch 222 may be grounded (for example connected to a 0 volts voltage source).

The first pulse circuit 200A as shown in the FIG. 2A and the second pulse circuit 200B as shown in the FIG. 2B may be configured to implement the EX-NOR operation and the EX-OR operation, respectively. In accordance with an embodiment, any one of the first pulse circuit 200A or the second pulse circuit 200B may be active at a time (for example in one UI), thus, any one of the generated first pulse signal (i.e. pullup pulse) or the second pulse signal (i.e. pulldown pulse) may be provided or fired to the state change circuit 110 at a time to drive the state change circuit 110. In other words, the first delay circuit 112 may be configured to control the enable switch 204 and the complementary reset switch 206 of the first pulse circuit 200A using the control signals (EN and XRST), and control the complimentary enable switch 220 and the reset switch 222 of the second pulse circuit 200B using the control signals (XEN and RST), such that one of the first pulse circuit 200A and the second pulse circuit 200B may be activated to generate or fire the first pulse signal and the second pulse signal, respectively, for the state change circuit 110 at a time or in one UI. For example, in one UI, when the first pulse circuit 200A is activated, then the second pulse circuit 200B may be deactivate based on the control signals, and vice versa.

The second pulse circuit 200B may be configured to receive the generated first clock signal from the state change circuit 110, such as via the complementary enable switch 220 and the reset switch 222. For example, when the first clock signal is at the low-level logic (such as "0"), the complementary enable switch 220 and the reset switch 222 may be activated or turn-on (i.e. using the control signals XEN and RST), which may further activate the second pulse circuit 200B to generate or fire the second pulse signal (i.e. pulldown pulse as shown in FIG. 2B). Moreover, the output (i.e. the second pulse signal) of the second pulse circuit 200B may be received from the output terminal 232 that may be connected to the sixth drain terminal 222C of the reset switch 222 and the third drain terminal 228C of the third edge detection switch 218C, as shown in FIG. 2B.

It may be noted that the second pulse circuit 200B in FIG. 2B is shown for one data input. The disclosed clock recovery circuit 104 may include N number of second pulse circuit 200B, where each second pulse circuit 200B of the N number of second pulse circuits may perform EX-OR operation with the corresponding data input of the plurality of data inputs. Examples of different values of data input and output of the second pulse circuit 200B, to indicate the operation of the second pulse circuit 200B, are presented in Table 2, as follows:

second pulse circuit 200B may implement an Exclusive-OR (EX-OR) operation, the output (i.e. second pulse signal) collected from the output terminal 232 may be "1" (i.e. when Data is "1" and Datadel is "0") as shown in the first row of Table 2. Similarly, for Data as "0" and Datadel as "1", the output of the second pulse circuit 200B is "1" as shown in a second row of Table 2. Further, for Data as "1" and Datadel as "1", the output of the second pulse circuit 200B is "0" as shown in a third row of Table 2. Similarly, for Data as "0" and Datadel as "0", the output of the second pulse circuit 200B is "0" as shown in a fourth row of Table 2. Further, in case the control signals XEN and RST are "1" and "0" respectively (as shown in a fifth row of Table 2), the complimentary enable switch 220 and the reset switch 222 of the second pulse circuit 200B may be deactivated, to further deactivate the second pulse circuit 200B to restrict the generation of the second pulse signal (i.e. pulldown pulse).

With respect to Table 1 and Table 2, the first pulse circuit 200A and the second pulse circuit 200B may be activated at different times. Thus, when the output (i.e. the first pulse signal) of the first pulse circuit 200A is generated, at the same time the output (i.e. the second pulse signal) of the second pulse circuit 200B is not generated based on the control signals provided by the first delay circuit 112 shown in FIG. 1. Alternatively, when the output (i.e. the second pulse signal) of the second pulse circuit 200B is generated, at the same time the output (i.e. the first pulse signal) of the first pulse circuit 200A is not generated based on the control signals provided by the first delay circuit 112 shown in FIG. 1.

Figure 3:
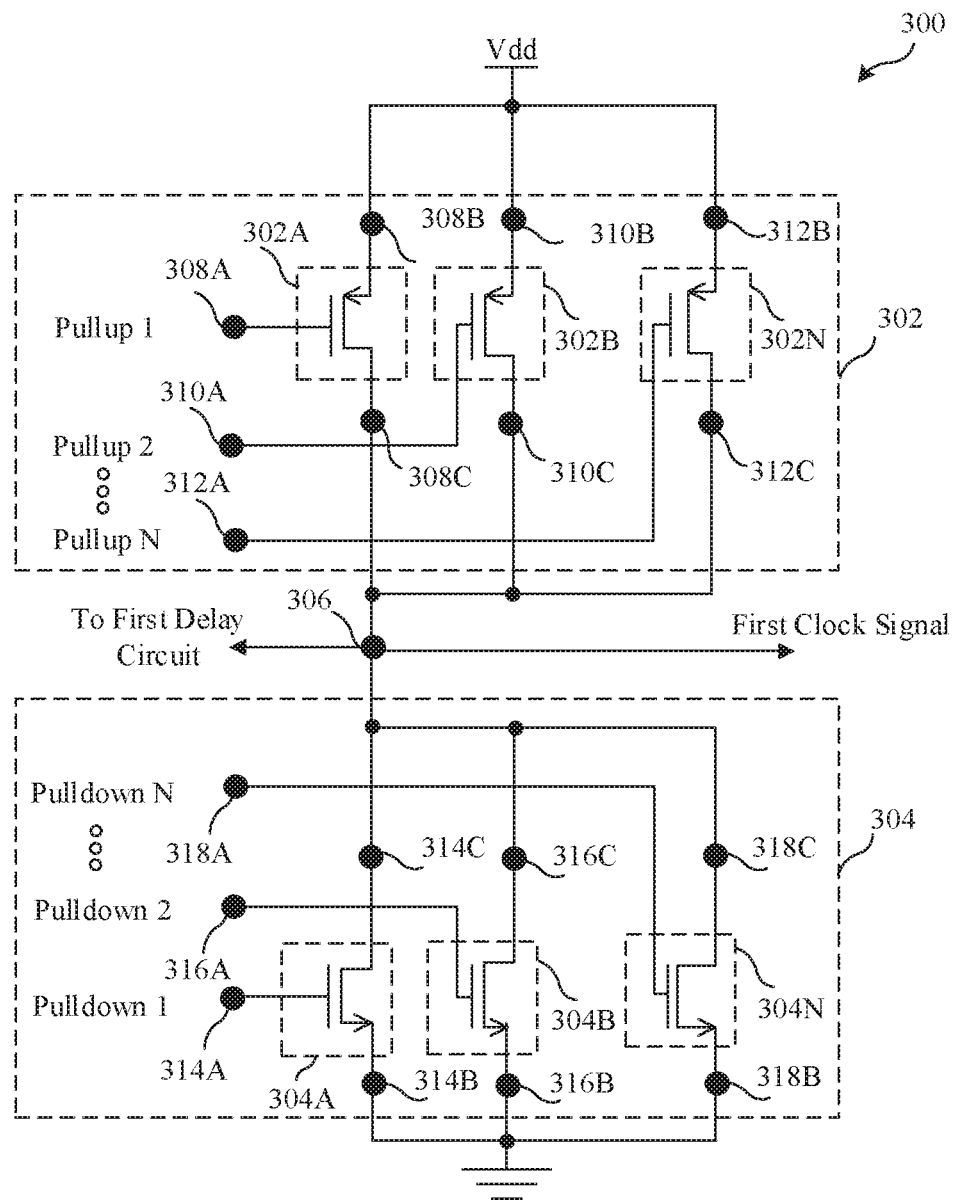
FIG. 3 is a schematic diagram of an exemplary state change circuit of the clock recovery circuit of FIG. 1, in accordance with an embodiment of the disclosure.

FIG. 3 is a schematic diagram of an exemplary state change circuit of the clock recovery circuit of FIG. 1, in

TABLE 2

Exemplary operation for the second pulse circuit

| Data Input and Delayed Data Input | | | | Control Signals | | Plurality Of Edge Detection Switches 218A-218D (PMOS) Of Second Pulse Circuit | | | | Output |
|---|---|---|---|---|---|---|---|---|---|---|
| Data | Datadel | XData | XDatadel | XEN | RST | 218A | 218B | 218C | 218D | |
| 1 | 0 | 0 | 1 | 0 | 1 | OFF | ON | ON | OFF | 1 |
| 0 | 1 | 1 | 0 | 0 | 1 | ON | OFF | OFF | ON | 1 |
| 1 | 1 | 0 | 0 | 0 | 1 | OFF | ON | OFF | ON | 0 |
| 0 | 0 | 1 | 1 | 0 | 1 | ON | OFF | ON | OFF | 0 |
| Any | | | | 1 | 0 | Second pulse circuit deactivated | | | | |

In an exemplary embodiment, the first clock signal received by the second pulse circuit 200B may be at the low-level logic, (i.e., "0") to activate the complimentary enable switch 220 and the reset switch 222 using the control signals (i.e. XEN and RST) of the second pulse circuit 200B. In a first instance, the data input ("Data") received by the first edge detection switch 218A may be "1", and the delayed data input ("Datadel") received by the third edge detection switch 218C may be "0" as shown in a first row of Table 2. Thus, the complementary data input ("XData") received by the second edge detection switch 218B may be "0" and the delayed complementary data input ("XDataDel") received by the fourth edge detection switch 218D may be "1". Thus, the first edge detection switch 218A (i.e. PMOS) and the fourth edge detection switch 218D (i.e. PMOS) of the second pulse circuit 200B may be in "OFF" state, whereas the second edge detection switch 218B and the third edge detection switch 218C of the second pulse circuit 200B may be in "ON" state, as shown in a first row of Table 2. As the accordance with an embodiment of the disclosure. FIG. 3 is explained in conjunction with elements from FIGS. 1, 2A, and 2B. With reference to FIG. 3, there is shown a state change circuit 300 (similar to the state change circuit 110 of FIG. 1). As shown in FIG. 3, the state change circuit 300 may include a first plurality of P-type MOSFET switches 302 which may further include a first pullup switch 302A, a second pullup switch 302B and a Nth pullup switch 302N. Further, the state change circuit 300 may include a second plurality of N-type MOSFET switches 304 which may further include a first pulldown switch 304A, a second pulldown switch 304B, and a Nth pulldown switch 304N. The state change circuit 300 may further include an output terminal 306 (i.e. similar to the output terminal 110C of the state change circuit 110 in FIG. 1) to output the first clock signal.

The first pullup switch 302A may include a first gate terminal 308A, a first source terminal 308B, and a first drain terminal 308C. The second pullup switch 302B may include a second gate terminal 310A, a second source terminal 310B, and a second drain terminal 310C. The Nth pullup switch 302N may include a Nth gate terminal 312A, a Nth source terminal 312B, and a Nth drain terminal 312C as shown in FIG. 3. Further, the first pulldown switch 304A may include a first gate terminal 314A, a first source terminal 314B, and a first drain terminal 314C. The second pulldown switch 304B may include a second gate terminal 316A, a second source terminal 316B, and a second drain terminal 316C. The Nth pulldown switch 304N may include a Nth gate terminal 318A, a Nth source terminal 318B, and a Nth drain terminal 318C.

The first gate terminal 308A of the first pullup switch 302A may be connected to an output terminal (such as the output terminal 216) of the first pulse circuit 200A (shown in FIG. 2A) to receive the first pulse signal (i.e. "Pullup 1" in FIG. 3) with respect to a first data input (such as "Data 1") of the plurality of data inputs. In other words, the first gate terminal 308A of the state change circuit 300 may be connected to the sixth drain terminal 206C of the complementary reset switch 206 (i.e. PMOS), the second drain terminal 210C of the second edge detection switch 202B (i.e. NMOS), and the first drain terminal 208C of the first edge detection switch 202A (i.e. NMOS) of the first pulse circuit 200A to receive the first pulse signal. Similarly, the second gate terminal 310A of the second pullup switch 302B may be connected to an output terminal of another pullup pulse generator circuit (i.e. similar to the first pulse circuit 200A and included in the first pulse circuit 106 of FIG. 1) to receive the first pulse signal (i.e. "Pullup 2" in FIG. 3) for a second data input (say "Data 2") of the plurality of data inputs. In addition, the Nth gate terminal 312A may be connected to an output terminal of an Nth first pulse circuit that may be in construction similar to the first pulse circuit 200A of FIG. 2A. In accordance with an embodiment, a number of the first plurality of P-type MOSFET switches 302 (such as the first pullup switch 302A, the second pullup switch 302B, and the Nth pullup switch 302N) in the state change circuit 110 may be equal to a number of data inputs and a number of the first pulse circuits 200A included in the first pulse circuit 106 of the clock recovery circuit 104. The first source terminal 308B, the second source terminal 310B, and the Nth source terminal 312B of the Nth pullup switch 302N may be connected to the voltage source ("Vdd" as shown in FIG. 3). The first drain terminal 308C, the second drain terminal 310C and the Nth drain terminal 312C of the Nth pullup switch 302N may be connected together to the output terminal 306 of the state change circuit 300 (similar to the output terminal 110C of the state change circuit 110 of FIG. 1), to provide the first clock signal. In an embodiment, each of the first plurality of P-type MOSFET switches 302 and the second plurality of N-type MOSFET switches 304 are high speed transistor or switches.

The first gate terminal 314A of the first pulldown switch 304A may be connected to an output terminal (such as the output terminal 232) of the second pulse circuit 200B (shown in FIG. 2B) to receive the second pulse signal (i.e. "Pulldown 1" in FIG. 3) with respect to the first data input (such as "Data 1") of the plurality of data inputs. In other words, the first gate terminal 314A of the state change circuit 300 may be connected to the sixth drain terminal 222C of the reset switch 222 (i.e. NMOS), the third drain terminal 228C of the third edge detection switch 218C (i.e. PMOS), and fourth drain terminal 230C of the fourth edge detection switch 218D (i.e. PMOS) of the second pulse circuit 200B to receive the second pulse signal. Similarly, the second gate terminal 316A of the second pulldown switch 304B may be connected to an output terminal of another pulldown pulse generator circuit (i.e. similar to the second pulse circuit 200B and included in the second pulse circuit 108 of FIG. 1) to receive the second pulse signal (i.e. "Pulldown 2" in FIG. 3) for a second data input (say "Data 2") of the plurality of data inputs. In addition, the Nth gate terminal 318A may be connected to an output terminal of an Nth second pulse circuit that may be in construction similar to the second pulse circuit 200B of FIG. 2B. In accordance with an embodiment, a number of the second plurality of N-type MOSFET switches 304 (such as the first pulldown switch 304A, the second pulldown switch 304B, and the Nth pulldown switch 304N) in the state change circuit 300 may be equal to a number of data inputs and a number of second pulse circuits 200B included in the second pulse circuit 108 of the clock recovery circuit 104. The first source terminal 314B of the first pulldown switch 304A, the second source terminal 316B of the second pulldown switch 304B, and the Nth source terminal 318B of the Nth pulldown switch 304N may be grounded as shown in FIG. 3. The first drain terminal 314C of the first pulldown switch 304A, the second drain terminal 316C of the second pulldown switch 304B, and the Nth drain terminal 318C of the Nth pulldown switch 304N may be connected together to the output terminal 306 of the state change circuit 300. The drain terminals of each of the first plurality of P-type MOSFET switches 302, such as the first drain terminal 308C, the second drain terminal 310C, and the Nth drain terminal 312C may be connected to the corresponding drain terminals of each of the second plurality of N-type MOSFET switches 304, such as the first drain terminal 314C, the second drain terminal 316C and the Nth drain terminal 318C to provide output (such as the first clock signal) of the state change circuit 300, via the output terminal 306, as shown in FIG. 3.

In accordance with an embodiment, the output terminal 306 may be connected to the input terminal 112A of the first delay circuit 112 (shown in FIG. 1) to provide the first clock signal from the state change circuit 300 to the first delay circuit 112. In other words, the output terminal 306 of the state change circuit 300 may be connected to the control signals (EN and XRST) of the first pulse circuit 106, via the first delay circuit 112, and connected to the control signals (XEN and RST) of the second pulse circuit 108, via the first delay circuit 112, to further control the activation or deactivation of the first pulse circuit and/or the second pulse circuit at a time or unit interval (UI) as described, for example, in FIGS. 2A and 2B.

In accordance with an embodiment, the clock recovery circuit 104 may include N number of data inputs (for example Data 1, Data 2, ... Data N), N number of first pulse circuit 200A, N number of second pulse circuit 200B, and one state change circuit 300. The one state change circuit 300 may include N number of pullup switches (i.e. first plurality of PMOS switches 302) and N number of pulldown switches (i.e. second plurality of NMOS switches 304) to receive respective pulse input (i.e. pullup or pulldown) from corresponding first pulse circuit 200A and the corresponding second pulse circuit 200B, respectively.

In operation, the state change circuit 300 may be configured to generate the first clock signal via the output terminal 306 (i.e. similar to the output terminal 110C shown in FIG. 1). The first plurality of P-type MOSFET switches 302 may receive a plurality of first pulse signals, such as from the N number of the first pulse circuit 200A. Each of the first pullup switch 302A, the second pullup switch 302B, and the Nth pullup switch 302N may receive the first pulse signal from a corresponding first pulse circuit 200A. The second plurality of N-type MOSFET switches 304 may receive a plurality of second pulse signals, such as from the N number of the second pulse circuit 200B. Each of the first pulldown switch 304A, the second pulldown switch 304B, and the Nth pulldown switch 304N may receive the second pulse signal from a corresponding second pulse circuit 200B. In accordance with an embodiment, any one of the first pulse circuit 200A and the second pulse circuit 200B may be active at a time (as described in FIG. 2B), therefore, at a time (for example in one UI) any one of the first pulse signal and the second pulse signal may be received by the state change circuit 300 to generate the first clock signal.

Examples of the first pulse signals received by the state change circuit 300 for the operation of the state change circuit 300 are presented in Table 3, as follows.

TABLE 3

Examples of the first pulse signals for operation of the state change circuit

| First pulse signals | | | First plurality of PMOS switches | | | Output Clock |
|---|---|---|---|---|---|---|
| Pullup 1 | Pullup 2 | Pullup N | 302A | 302B | 302N | First clock signal |
| 0 | 1 | 1 | ON | OFF | OFF | 1 |
| 1 | 0 | 1 | OFF | ON | OFF | 1 |
| 1 | 1 | 0 | OFF | OFF | ON | 1 |
| 1 | 1 | 1 | OFF | OFF | OFF | NC |

As shown in Table 3, in a first row, when the first pulse signal (i.e. Pullup 1) for the first data input ("Data 1") received by the first pullup switch 302A is "0", then the first pullup switch 302A is in "ON" state. However, when the first pulse signal (i.e. Pullup 2) for the second data input ("Data 2") received by the second pullup switch 302B is "1" and the first pulse signal (i.e. Pullup N) for Nth data input ("Data N") received by the Nth pullup switch 302N are "1", then the second pullup switch 302B and the Nth pullup switch 302N are in the "OFF" states, as shown in a first row of Table 3. Therefore, the first clock signal (as the output of the state change circuit 300) is pulled to the high logic level "1". In a second instance, when Pullup 1 is "1", Pullup 2 is "0", and Pullup N is "1", thus, only the second pullup switch 302B may be in the "ON" state, as shown in a second row of Table 3. Therefore, the first clock signal is pulled to the high logic level "1". In another instance, when all of the first plurality of P-type MOSFET switches 302 are in the "OFF" states, the first clock signal (i.e. output of the state change circuit 300) may not change a state (i.e. no change (NC) or high-impedance state). Therefore, the state change circuit 300 may be able to detect "0" level in any of the first pulses signals with respect to the plurality of data inputs, to generate the first clock signal as "1", as shown in Table 3.

Examples of the second pulse signals received by the state change circuit 300 for the operation of the state change circuit 300 are presented in Table 4, as follows.

TABLE 4

Examples of the second pulse signals for operation of state change circuit

| Second pulse signals | | | Second plurality of NMOS switches | | | Output Clock |
|---|---|---|---|---|---|---|
| Pulldown 1 | Pulldown 2 | Pulldown N | 304A | 304B | 304N | First clock signal |
| 1 | 0 | 0 | ON | OFF | OFF | 0 |
| 0 | 1 | 0 | OFF | ON | OFF | 0 |
| 0 | 0 | 1 | OFF | OFF | ON | 0 |
| 0 | 0 | 0 | OFF | OFF | OFF | NC |

As shown in a first row in Table 4, in a first instance, when the second pulse signal (i.e. Pulldown 1) for the first data input ("Data 1") received by the first pulldown switch 304A is "1", then the first pulldown switch 304A is in an "ON" state. However, when the second pulse signal (i.e. Pulldown 2) for the second data input ("Data 2") received by the second pulldown switch 304B, and the second pulse signal (i.e. Pulldown N) for the Nth data input ("Data N") received by the Nth pulldown switch 304N are "0", then the second pulldown switch 304B and the Nth pulldown switch 304N are in the "OFF" states, as shown in a first row of Table 4. Therefore, the first clock signal (as the output of the state change circuit 300) is pulled to the low logic level "0". In a second instance, when Pulldown 1 is "0", Pulldown 2 is "1", and Pulldown N is "0", thus, only the second pulldown switch 304B may be in the "ON" state and the first clock signal is pulled to the low logic level "0", as shown in a second row of Table 4. In another instance, when all of the second plurality of N-type MOSFET switches 304 are in the "OFF" states, the first clock signal (i.e. output of the state change circuit 300) may not change a state (i.e. NC or high impedance state). Therefore, the state change circuit 300 may be able to detect "1" level in any of the second pulses signals with respect to the plurality of data inputs, to generate the first clock signal as "0", as shown in Table 4.

In accordance with an embodiment, at one time instant (for example one UI), the first plurality of P-type MOSFET switches 302 may be active that may be configured to pull up the first clock signal to the high-level logic "1", based on the received first pulse signals from the first pulse circuit 106 of FIG. 1. Similarly, at a next instant of time (for example another UI), the second plurality of N-type MOSFET switches 304 may be active that may be configured to pull down the first clock signal to the Low level logic "0", based on the received second pulse signals from the second pulse circuit 108 of FIG. 1. The transitions of the first clock signal with respect to the first pulse signal and the second pulse signal are described, for example, in FIG. 5.

Figure 4A:
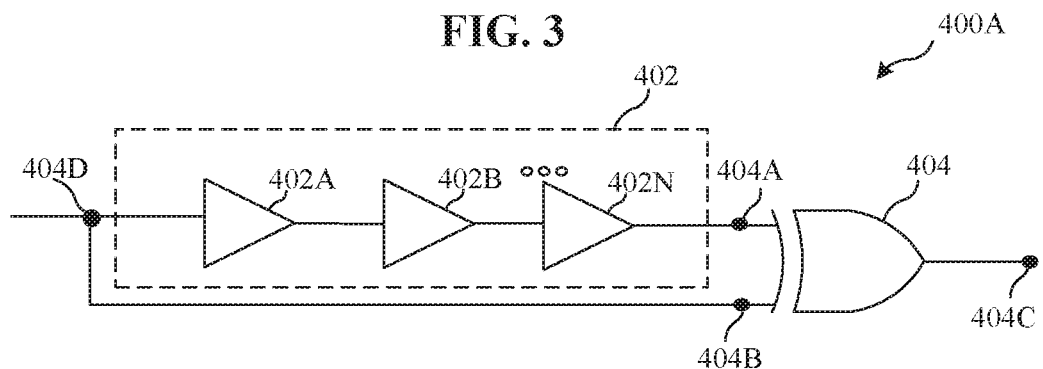
FIG. 4A is a schematic diagram including a delay circuit and pulse circuit of the clock recovery circuit of FIG. 1, in accordance with an embodiment of the disclosure.

FIG. 4A is a schematic diagram including the first delay circuit and pulse circuit of the clock recovery circuit of FIG. 1, in accordance with an embodiment of the disclosure. FIG. 4A is explained in conjunction with elements from FIGS. 1, 2A, 2B, and 3. With reference to FIG. 4A, there is shown a pulse circuit 404 (i.e. similar to the first pulse circuit 200A in FIG. 2A or the second pulse circuit 200B in FIG. 2B). The pulse circuit 404 may be configured to implement EX-OR function. In some embodiments, the pulse circuit 404 may be configured to implement EX-OR or EX-NOR function. In FIG. 4A, there is further shown a first delay circuit 402 which may include a plurality of inverter circuits, for example a first inverter circuit 402A, a second inverter circuit 402B, and Nth inverter circuit 402N, as delay buffers. The first delay circuit 402 may be configured to receive the first clock signal from the state change circuit 300 (via an input terminal 404D), and provide the delayed first clock signal to the pulse circuit 404 (via an input terminal 404A). The first delay circuit 402 may be able to control an amount of the delay (or mask time) based on number of inverter circuits included in the first delay circuit 402. It may be noted that three inverter circuits in the first delay circuit 402 shown in FIG. 4A are presented as example. The first delay circuit 402 may include any number of inverter circuits to control the amount of delay and mask time to be provided to the first clock signal and control pulse circuits, without any deviation from the scope of the disclosure. In some embodiments, the first delay circuit 402 may correspond to the second delay circuit 116 and the third delay circuit 118 to provide the uncontrolled delay to the plurality of data inputs so that the first pulse circuit 106 and the second pulse circuit 108 may perform EX-NOR and EX-OR operations, respectively, based on input provided via input terminals 404A and 404B, as described, for example, in FIGS. 1, 2A, and 2B.

Figure 4B:
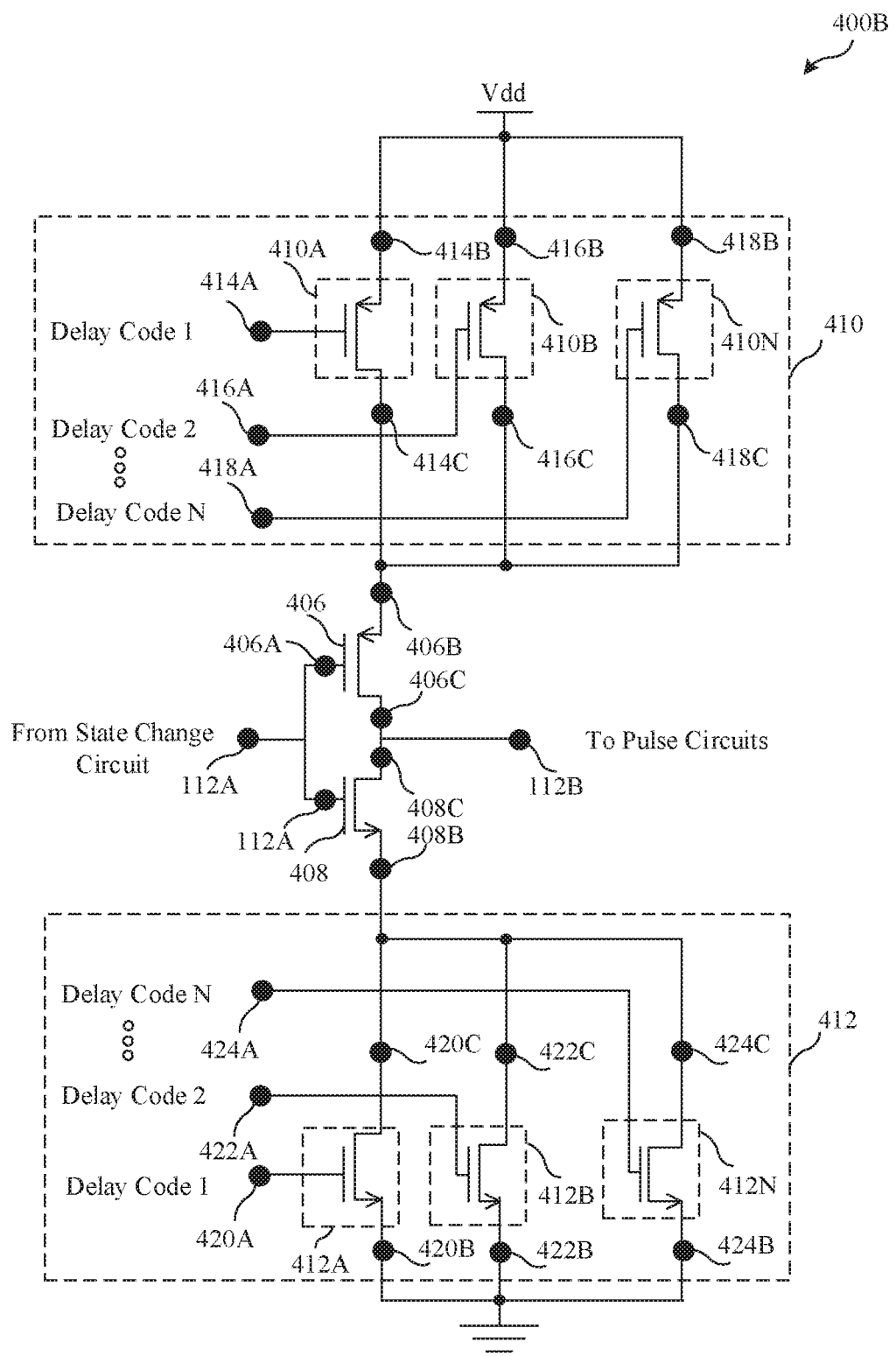
FIG. 4B is a schematic diagram of an exemplary first delay circuit, in accordance with an embodiment of the disclosure.

FIG. 4B is a schematic diagram of an exemplary first delay circuit, in accordance with an embodiment of the disclosure. FIG. 4B is explained in conjunction with elements from FIGS. 1, 2A, 2B, and 3. With reference to FIG. 4B, there is shown a first delay circuit 400B, similar to the first delay circuit 112 of FIG. 1. In accordance with an embodiment, the first delay circuit 400B may include a PMOS switch 406 and an NMOS switch 408. The combination of the PMOS switch 406 and the NMOS switch 408 may form an inverter circuit (as a buffer circuit). The first delay circuit 400B may further include a first set of PMOS switches 410 and a second set of NMOS switches 412. The first set of PMOS switches 410 may include a first PMOS switch 410A, a second PMOS switch 410B, and an Nth PMOS switch 410N. The second set of NMOS switches 412 may include a first NMOS switch 412A, a second NMOS switch 412B, and an Nth NMOS switch 412N.

As per FIG. 4B, the PMOS switch 406 may include a first gate terminal 406A, a first source terminal 406B, and a first drain terminal 406C. The NMOS switch 408 may include a second gate terminal 408A, a second source terminal 408B, and a second drain terminal 408C. The first PMOS switch 410A may include a third gate terminal 414A, a third source terminal 414B, and a third drain terminal 414C. The second PMOS switch 410B may include a fourth gate terminal 416A, a fourth source terminal 416B, and a fourth drain terminal 416C. The Nth PMOS switch 410N may include a fifth gate terminal 418A, a fifth source terminal 418B, and a fifth drain terminal 418C. The first NMOS switch 412A may include a sixth gate terminal 420A, sixth source terminal 420B, and a sixth drain terminal 420C. The second NMOS switch 412B may include a seventh gate terminal 422A, a seventh source terminal 422B, and a seventh drain terminal 422C. The Nth NMOS switch 412N may include an eighth gate terminal 424A, an eighth source terminal 424B, and an eighth drain terminal 424C, as shown in FIG. 4B.

The first gate terminal 406A and the second gate terminal 408A may be connected together to receive the first clock input from the state change circuit 110 of FIG. 1 or the state change circuit 300 of FIG. 3. The first gate terminal 406A and the second gate terminal 408A may be connected to the output terminal 110C of the state change circuit 110 or the output terminal 306 of the state change circuit 300. Moreover, the connection of the first gate terminal 406A and the second gate terminal 408A may correspond to a node, such as the input terminal 112A of the first delay circuit 112 of FIG. 1. The first drain terminal 406C may be connected to the second drain terminal 408C as shown in FIG. 4A. The connection of the first drain terminal 406C and the second drain terminal 408C may correspond to a terminal, such as the output terminal 112B of the first delay circuit 112 of FIG. 1. In other words, the output terminal 112B of the first delay circuit 400B may be connected to the N-type MOSFET enable switch 204 and the P-type MOSFET complementary reset switch 206 of the first pulse circuit 200A, to provide the control signals (EN and XRST). Further, the output terminal 112B of the first delay circuit 400B may be connected to the P-type MOSFET complimentary enable switch 220 and the N-type MOSFET reset switch 222 of the second pulse circuit 200B, to provide the control signals (EN and XRST). The output (i.e. delayed first clock signal) from the first delay circuit 400B, may control the control signals (EN, XRST, XEN, and RST) to further activate or deactivate the first pulse circuit 200A and/or the second pulse circuit 200B, to further to mask or ignore the other transitions of the plurality of data inputs in the first UI as described, for example, in FIG. 5.

As shown in FIG. 4B, the third drain terminal 414C, the fourth drain terminal 416C, and the fifth drain terminal 418C may be connected to the first source terminal 406B. Moreover, the third source terminal 414B, the fourth source terminal 416B, and the fifth source terminal 418B may be connected to the voltage source (such as "Vdd"). The sixth drain terminal 420C, the seventh drain terminal 422C and the eighth drain terminal 424C may be connected to the second source terminal 408B of the NMOS switch 408. The sixth source terminal 420B, the seventh source terminal 422B, and the eighth source terminal 424B may be grounded, as shown in FIG. 4B. Furthermore, the third gate terminal 414A of the first PMOS switch 410A and the sixth gate terminal 420A of the first NMOS switch 412A may be connected to a first external delay code circuit (not shown). The fourth gate terminal 416A of the second PMOS switch 410B and the seventh gate terminal 422A of the second NMOS switch 412B may be connected to a second external delay code circuit (not shown). The fifth gate terminal 418A of the Nth PMOS switch 410N and the eighth gate terminal 424A of the Nth NMOS switch 412N may be connected to an Nth external delay code circuit (not shown). The first external delay code circuit, the second external delay code circuit, and the Nth external delay code circuit may be external to the first delay circuit 400B. The first external delay code circuit may provide a first delay value (for example "delay code 1" in FIG. 4B) to turn-on or turn-off the first PMOS switch 410A and/or the first NMOS switch 412A during a configuration time of the clock recovery circuit 104. Similarly, the second external delay code circuit may provide a second delay value (for example "delay code 2" in FIG. 4B) to turn-on or turn-off the second PMOS switch 410B and/or the second NMOS switch 412B during the configuration time. In some embodiment, the first delay value and the second delay value may not change during a normal operation of the clock recovery circuit 104 to recover the first clock signal or the timing information indicating the first transition of one of the plurality of data inputs. The operation state (i.e. turn-on or turn-off) of one or more switches of the first set of PMOS switches 410 and the second set of NMOS switches 412 set during the configuration time, may control the amount of delay provided by the first delay circuit 400B during the normal operation of the clock recovery circuit 104. In some embodiments, each of the first set of PMOS switches 410 and the second set of NMOS switches 412 may be low-speed switches.

In accordance with an embodiment, the first delay circuit 400B may be configured to generate a variable delay to mask the other transitions (i.e. other than the first transition of one data input) of the plurality of data inputs in the first UI. The variable delay may be provided by the first delay circuit 400B in the generated first clock signal, and further delayed first clock signal may be fed to the first pulse circuit 106 and the second pulse circuit 108 of FIG. 1 as the control signals (i.e. EN, XRST, XEN, and RST). In accordance with an embodiment, the first delay circuit 400B may include the inverter circuit (with the combination of the PMOS switch 406 and the NMOS switch 408), as a buffer circuit, to generate the variable delay which may be controlled during the normal operation of the clock recovery circuit 104. For N number of data inputs, the number of the first delay circuit 400B may be one, to control the first pulse circuit 106 and the second pulse circuit 108 including the plurality of pulse circuits (like the first pulse circuit 200A and the second pulse circuit 200B in FIGS. 2A and 2B) for the plurality of data inputs. In an embodiment, the first delay circuit 112 or the first delay circuit 400B may provide a controlled amount of delay for the first control signal or controlled amount of mask time, which may be dependent on various factors, but not limited to, transmission channel, data rate at which the plurality of data inputs may be communicated, or a transmitter or receiver circuit behavior which may include the clock recovery circuit 104. In some embodiments, the amount of delay provided by the first delay circuit 112 may depend on variations in, but not limited to, temperature or voltage changes in input or reference voltages. Different techniques to vary or control the amount of delay by the first delay circuit 112 is described, for example, in FIGS. 4B, 6, and 7. In some other embodiments, the current available to the inverter circuit (i.e. buffer) may be modified by changing number of switches or circuits turned on through the supplies of the inverter circuit in the first delay circuit 400B. As the current may be reduced by turning off the switches, a rise or fall time of the inverter circuit and hence the amount of delay (or mask time) may be increased.

Figure 5:
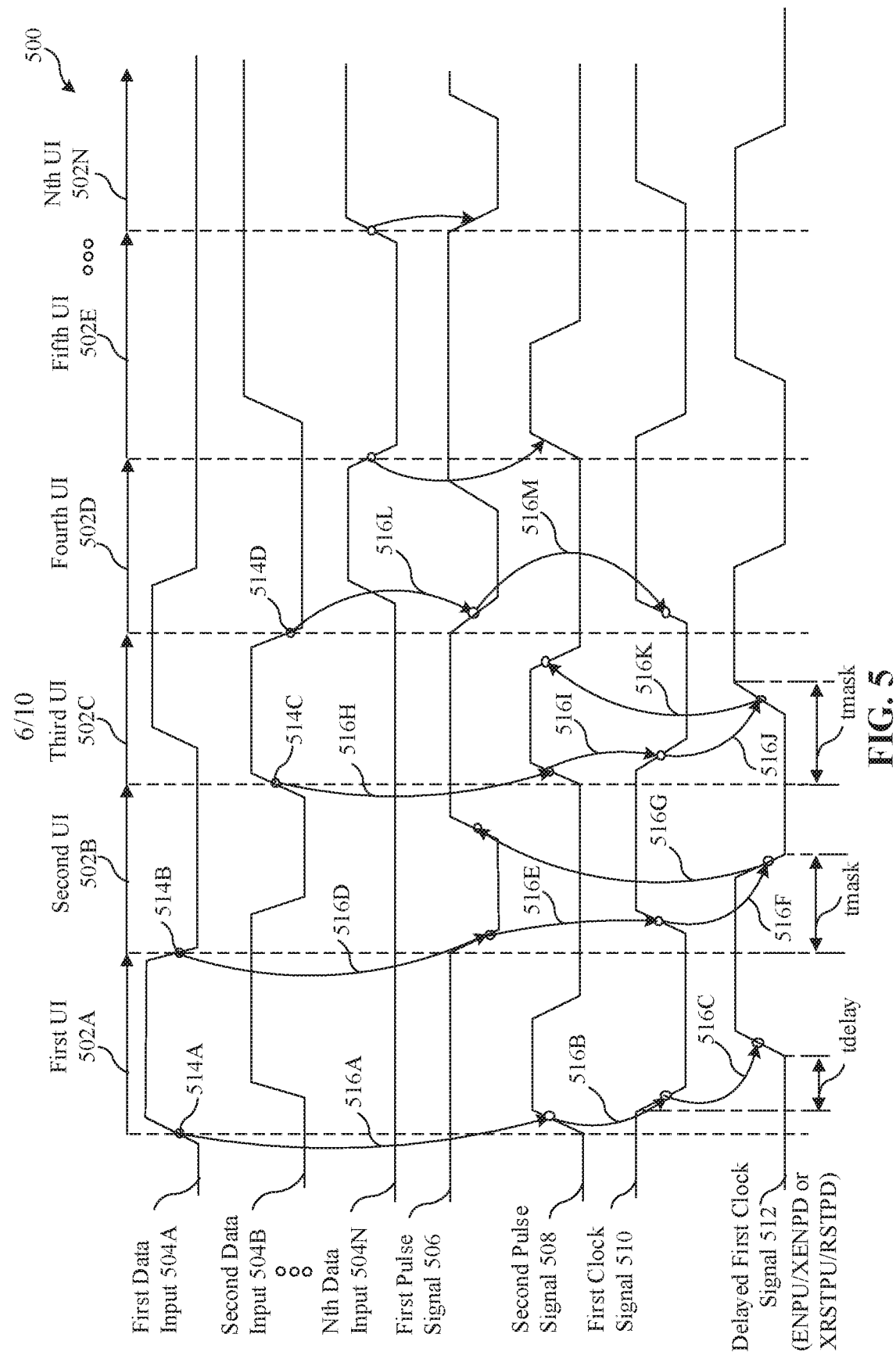
FIG. 5 is a timing diagram that depicts generation of a first clock signal and masking of transitions of data inputs, in accordance with an embodiment of the disclosure.

FIG. 5 is a timing diagram that depicts generation of a first clock signal and masking of transitions of data inputs, in accordance with an embodiment of the disclosure. FIG. 5 is explained in conjunction with elements from FIG. 1, FIG. 2A. FIG. 2B, FIG. 3, FIG. 4A, and FIG. 4B. With reference to FIG. 5, there is shown a timing diagram 500. The timing diagram 500 may include a first unit interval (UI) 502A, a second UI 502B, a third UI 502C, a fourth UI 502D, and fifth 502E, and a Nth UI 502N. As shown in FIG. 5, the timing diagram 500 further include a first data input 504A ("Data 1"), a second data input 504B ("Data 2"), and an Nth data input 504N as the plurality of data inputs. The timing diagram 500 further may include a first pulse signal 506 (referred as the pullup signal) and a second pulse signal 508 (referred as the pulldown signal). The first pulse signal 506 and the second pulse signal 508 may be generated by the first pulse circuit 200A and the second pulse circuit 200B as described, for example, in FIGS. 2A and 2B. The timing diagram 500 may further include a first clock signal 510 and a delayed first clock signal 512 (referred as "ENPU/XENPD & XRSTPU/RSTPD" as control signals) which may be, for example, a complement and/or delayed version of the first clock signal generated by the state change circuit 300.

As shown in FIG. 5, one or more of the plurality of data inputs may make a transition (i.e. either from High to Low or Low to High, maximum one time) in each UI. In the first UI 502A, the first data input 504A may undergo a first transition 514A, (i.e. a foremost or first transition of the first UI 502A in comparison to other data inputs, such as the second data input 504B and the Nth data input 504N). Thus, during the first UI 502A, the second pulse circuit 200B may control the second pulse signal 508 to make transition (say from Low to High as indicated by transition 516A), based on detection of the first transition 514A in the first data input 504A. In an embodiment, in the first UI 502A, the second pulse circuit 200B may be activated (i.e. enabled state) based on corresponding control signals to provide or fire the second pulse signal 508 for the state change circuit 300. In the same first UI 502A, the first pulse circuit 200A may be deactivated (i.e. reset state) based on the corresponding control signals. Correspondingly, as shown in FIG. 5, the first clock signal 510 may transition to the "Low" level logic "0" (i.e. transition 516B) by the state change circuit 300 based on the second pulse signal 508 received from the second pulse circuit 200B, as described, for example, in FIG. 3. Thus, based on the foremost transition in the first data input 504A in the first UI 502A, the disclosed clock recovery circuit 104 recovers the first clock signal 510 with the transition 516B in FIG. 5. This recovered or generated first clock signal 510 may indicate the timing information associated with the plurality of data inputs. For example, the timing information may indicate a start of first transition 514A in the first UI 502A. Based on the recovered first clock signal 510, the disclosed electronic device 102 may sample or recover the received plurality of data inputs during the first UI 502A.

Further, based on the first clock signal 510 provided by the state change circuit 300, the first delay circuit 112 may provide the delayed first clock signal 512 (for example such delay is represented as "tdelay" in the first UI 502A in FIG. 5) which may make transition 516C, as shown in FIG. 5. The delayed first clock signal 512 may be further fed to the first pulse circuit 106 (or the corresponding first pulse circuit 200A) and the second pulse circuit 108 (or the corresponding second pulse circuit 200B) via the first delay circuit 112 of FIG. 1. In other words, as shown in FIG. 5, the delayed first clock signal 512 may be initially set to "0" to activate the second pulse circuit 200B, with the control signals (XEN and RST) during the first UI 502A, to further generate the second pulse signal 508 (i.e. firing state of the second pulse circuit 200B). In embodiment, the state change circuit 300 may be configured to hold the generated first clock signal 510 for the first UI 502A.

Further, in the first UI 502A, the delayed first clock signal 512 may make transition (i.e. 516C) as being the delayed version of the first clock signal 510. The delayed first clock signal 512 may further deactivate (i.e. reset state) the second pulse circuit 200B during the first UI 502A to mask or ignore the transitions of other data inputs (for examples the second data input 504B or other data inputs). Therefore, during the first UI 502A, only the foremost transition of the first data input 504A may be considered to generate the second pulse signal 508 by the second pulse circuit 200B and generate the first clock signal 510 by the state change circuit 300, and all other transitions of the other data inputs (i.e. the second data input 504B) are masked by the delayed first clock signal 512 (for example a duration of masking is represented as "tmask" in FIG. 5) provided by the first delay circuit 112. The first delay circuit 112 controlled by the state change circuit 300 may mask the other transitions to limit the clock generation or state change during the first UI 502A. In an embodiment, the mask time may vary between, but not limited to, 35% to 60% of actual UI time of the clock recovery circuit 104. Further, due to the transition (Low to High) in the delayed first clock signal 512, the first delay circuit 112 may activate (i.e. enabled state) the first pulse circuit 200A for the second UI 502 (using the control signal EN and XRST).

In the second UI 502B, the first data input 504A may undergo a second transition 514B, (i.e. a foremost or earliest transition of the second UI 502B in comparison to other data inputs). Thus, first pulse circuit 200A may control the first pulse signal 506 to make transition (say High to Low indicated by transition 516D), in the second UI 502B, based on the detection of the second transition 514B in the first data input 504A. In an embodiment, in the second UI 502B, the first pulse circuit 200A may be activated (i.e. enabled state) based on corresponding control signals to provide or fire the first pulse signal 506 for the state change circuit 300. In the same second UI 502B, the second pulse circuit 200B may be deactivated (i.e. reset state) based on the corresponding control signals. Correspondingly, as shown in FIG. 5, the first clock signal 510 may transition to the High level logic "1" (i.e. transition 516E) by the state change circuit 300 based on the first pulse signal 506 received from the first pulse circuit 200A, as described, for example, in FIG. 3. Thus, based on the foremost transition (i.e. second transition 514B) in the first data input 504A in the second UI 502B, the clock recovery circuit 104 recovers the first clock signal 510 with the transition 516E as shown in FIG. 5. Further, based on the first clock signal 510 provided by the state change circuit 300, the first delay circuit 112 may provide the delayed first clock signal 512 which may make transition 516F, as shown in FIG. 5. The delayed first clock signal 512 (i.e. provided by the first delay circuit 112 of FIG. 1) may be further fed, as the control signals (XEN and RST), to deactivate (i.e. as shown by transition 516G) the first pulse circuit 200A based on the recovery or generation of the first clock signal 510, and to further mask or ignore the transitions of other data inputs (for examples the second data input 504B or other data inputs) during the remaining time of the second UI 502B. Therefore, during the second UI 502B, only the foremost transition of the first data input 504A may be considered to generate the first pulse signal 506 by the first pulse circuit 200A and the first clock signal 510 by the state change circuit 300, and all other transitions of the other data inputs (i.e. the second data input 504B) are masked (for example for the duration "tmask" shown in the second UI 502B in FIG. 5) or ignored by the delayed first clock signal 512 provided by the first delay circuit 112.

Similarly, in the third UI 502C, the second data input 504B may undergo a third transition 514C, (i.e. a foremost or earliest transition in the third UI 504C before the transitions of other data inputs, such as the first data input 540A). In the third UI 504C, the second pulse circuit 200B may be further activated (i.e. enabled state) based on the control signals provided by the first delay circuit 112 and the first pulse circuit 200A may be deactivated (i.e. reset state). Thus, in response to the third transition 514C, the second pulse circuit 200B may control the second pulse signal 508 to make transition (Low to High indicated by transition 516H) in the third UI 502C. Correspondingly, the first clock signal 510 may again transition to the Low level logic "0" (i.e. transition 516I) by the state change circuit 300 based on the second pulse signal 508 received from the second pulse circuit 200B. Thus, based on the foremost transition in the second data input 504B in the third UI 502C, the clock recovery circuit 104 recovers the first clock signal 510 with the transition 516I in FIG. 5. Further, based on the first clock signal 510 provided by the state change circuit 300, the first delay circuit 112 may provide the delayed first clock signal 512 which may make transition 516J, as shown in FIG. 5. The delayed first clock signal 512 (i.e. provided by the first delay circuit 112 of FIG. 1) may be further fed, as the control signals (EN and XRST), to deactivate (i.e. as shown by transition 516K) the second pulse circuit 200B based on the recovery or generation of the first clock signal 510, and to further mask (for example for the duration "tmask" in the third UI 502C shown in FIG. 5) or ignore the transitions of other data inputs (for examples the first data input 504A or other data inputs) during the remaining time of the third UI 502C.

Similarly, as shown in FIG. 5, during the fourth UI 502D, the first pulse circuit 200A may be activated (i.e. enabled state) again based on the control signals (i.e. EN/XRST driven by the delayed first clock signal 512), to detect a first transition 514D in the second data input 504B and make transition (i.e. High to Low indicated by transition 516L) in the first pulse signal 506. Further, in response to the transition of the first pulse signal 506, the state change circuit 200 may control the first clock signal 510 to make transition (i.e. 516M to pullup the clock) and act as a recovered clock for the foremost transition 514D in the fourth UI 502D. The recovered first clock signal 510 may further control the first delay circuit 112 to mask or ignore other transitions of other data inputs (such as the first data input 504A) during remaining time of the fourth UI 502D. Thus, the disclosed clock recovery circuit 104 may be able to generate and trigger the clock (i.e. first clock signal 510) at every first transition detected in one of the plurality of data inputs in the UI, to effectively sample or synchronize the plurality of data inputs. The disclosed clock recovery circuit 104 may mask the other transitions in the same UI to avoid any incorrect generation or transition in the recovered clock during the same UI. This may further enhance the accuracy of reception of the plurality of data inputs with timely generation of the clock pulse at detection of a first transition in any data input during all unit intervals (UI). This effective recovery of the first clock signal at every UI based on the detection of the foremost transition may provide accurate reception and sampling of the data signal, even if the reception device does not include a local clock source (like crystal clock source) or include the clock source which provides incorrect clock timings to recover the data inputs.

Figure 6:
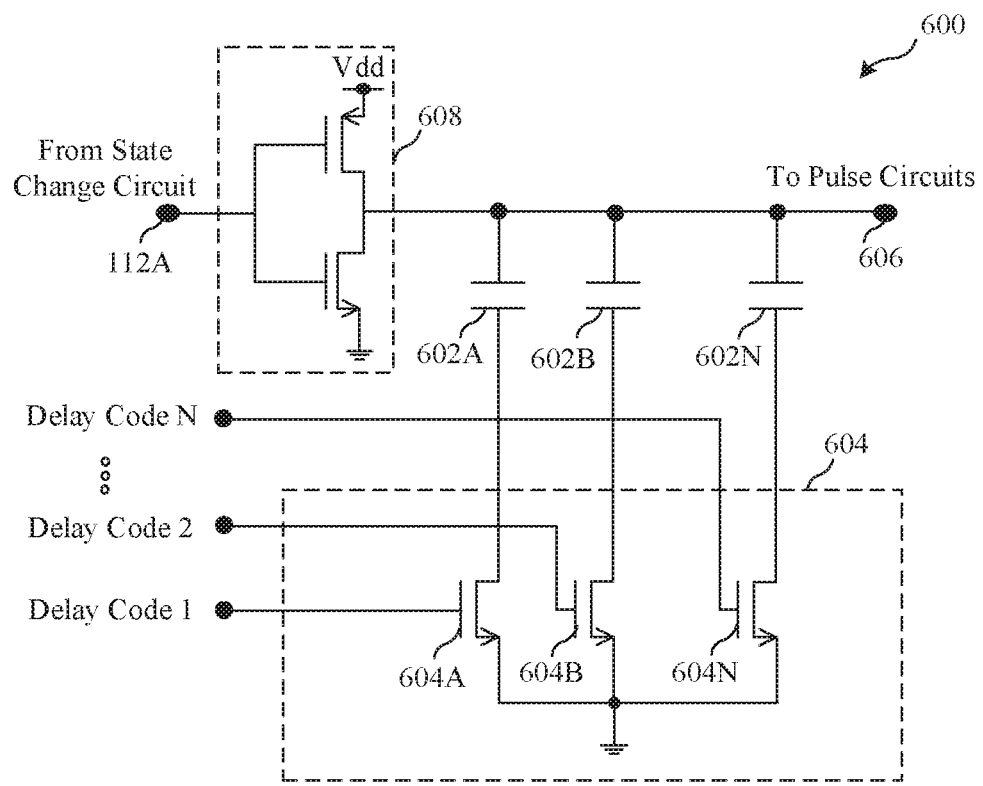
FIG. 6 is a schematic diagram of an exemplary first delay circuit that includes a plurality of fixed capacitors, in accordance with an embodiment of the disclosure.

FIG. 6 is a schematic diagram of an exemplary first delay circuit that includes a plurality of fixed capacitors, in accordance with an embodiment of the disclosure. FIG. 6 is explained in conjunction with elements from FIG. 1, FIG. 2A. FIG. 2B, FIG. 3, FIG. 4A, FIG. 4B and FIG. 5. With reference to FIG. 6, there is shown a first delay circuit 600. The first delay circuit 600 may include a first capacitor 602A, a second capacitor 602B and an Nth capacitor 602N. The first delay circuit 600 may further include a set of NMOS switches 604, (similar to the second set of NMOS switches 412 of FIG. 4B). The first delay circuit 600 may include an output terminal 606, (similar to the output terminal 112B of the first delay circuit 112 in FIG. 1). The set of NMOS switches 604 may include a first NMOS switch 604A, (such as the first NMOS switch 412A), a second NMOS switch 604B, (such as the second NMOS switch 412B), and an Nth NMOS switch 604N, (such as the Nth NMOS switch 412N of FIG. 4B).

The first capacitor 602A may be connected to a drain terminal of the first NMOS switch 604A and the output terminal 606. The second capacitor 602B may be connected to a drain terminal of the second NMOS switch 604B and the output terminal 606. The Nth capacitor 602N may be connected to a drain terminal of the Nth NMOS switch 604N and the output terminal 606 as shown in FIG. 6. The first delay circuit 600 may further include a MOS inverter circuit 608 which may be similar to the combination of the PMOS switch 406 and the NMOS switch 408 shown in FIG. 4B. The MOS inverter circuit 608 may be connected to the output terminal 606 and each of the first capacitor 602A, the second capacitor 602B, and the Nth capacitor 602N as shown in FIG. 6.

In accordance with an embodiment, the first capacitor 602A, the second capacitor 602B, and the Nth capacitor 602N in the first delay circuit 600 may be configured to provide a delay to the first clock signal provided by the state change circuit 300, via the input terminal 112A. Each of the first capacitor 602A, the second capacitor 602B, and the Nth capacitor 602N may have a fixed capacitance value, such that the first delay circuit 600 may provide a controlled amount of delay to the received first clock signal to accordingly control the time or duration to mask the other transitions of other data inputs (i.e. other than first transition in a unit interval (UI)), as described, for example, in FIG. 5. The amount of the delay may be provided by a charging time or discharging time of the each of the first capacitor 602A, the second capacitor 602B, and the Nth capacitor 602N. As an example, in case of increase in a total capacitance (i.e. provided by the first capacitor 602A, the second capacitor 602B, and the Nth capacitor 602N), the rise/fall time of the MOS inverter circuit 608 and the amount of delay may increase. As more number of capacitors may be added to the first delay circuit 600, an amount of delay of the MOS inverter circuit 608 (or buffer circuit) may increase, thereby more delay for the first clock signal provided by the state change circuit 300.

Figure 7:
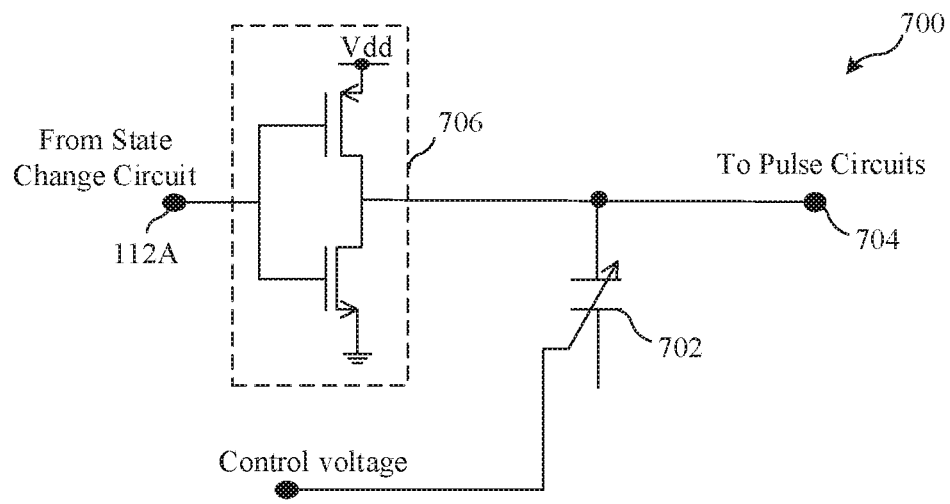
FIG. 7 is a schematic diagram of an exemplary first delay circuit that includes a variable capacitor, in accordance with an embodiment of the disclosure.

FIG. 7 is a schematic diagram of an exemplary first delay circuit that includes a variable capacitor, in accordance with an embodiment of the disclosure. FIG. 7 is explained in conjunction with elements from FIG. 1, FIG. 2A. FIG. 2B, FIG. 3, FIG. 4A, FIG. 4B, FIG. 5 and FIG. 6. With reference to FIG. 7, there is shown a first delay circuit 700. The first delay circuit 700 may include a variable capacitor 702 and an output terminal 704 (similar to the output terminal 112B of the first delay circuit 112 in FIG. 1). The first delay circuit 700 may further include a MOS inverter circuit 706 which may ee similar to the combination of the PMOS switch 406 and the NMOS switch 408 shown in FIG. 4B. The MOS inverter circuit 706 may be connected to the output terminal 704 and the variable capacitor 702. In an embodiment, the variable capacitor 702 in the first delay circuit 700 may be a digitally controlled switched capacitor that may control (i.e. increase or decrease) the amount of delay provided to the first clock signal. The capacitance of the variable capacitor 702 or the amount of the delay may be controlled based on a control voltage (as shown in FIG. 7) which may be received from a control circuit (not shown) external to the clock recovery circuit 104.

Figure 8:
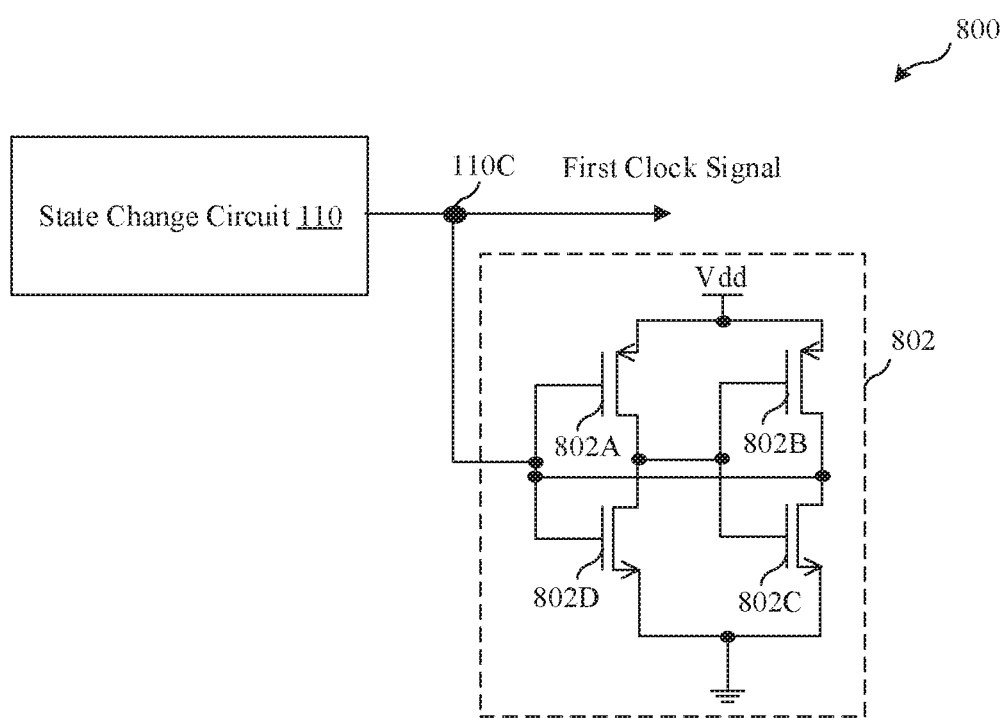
FIG. 8 is a schematic diagram of an exemplary circuit that includes a pseudo-dynamic logic to control leakage current, in accordance with an embodiment of the disclosure.

FIG. 8 is a schematic diagram of an exemplary circuit that includes a pseudo-dynamic logic to control leakage current, in accordance with an embodiment of the disclosure. FIG. 8 is explained in conjunction with elements from FIG. 1, FIG. 2A. FIG. 2B, FIG. 3, FIG. 4A, FIG. 4B, FIG. 5, FIG. 6, and FIG. 7. With reference to FIG. 8, there is shown a scenario 800, which may include the state change circuit 110 to provide the first clock signal via the output terminal 110C as described in FIGS. 1 and 3. As per FIG. 8, the state change circuit 110 may include a circuit 802. The circuit 802 may include back-to-back holding inverters formed by a first combination of a PMOS switch 802A and a NMOS switch 802D, and a second combination of a PMOS switch 802B and a NMOS switch 802C as shown in FIG. 8. The circuit 802 may be referred as pseudo dynamic logic to avoid corruption of the data inputs due to parasitic leakage in the electronic device 102 or the clock recovery circuit 104.

Figure 9:
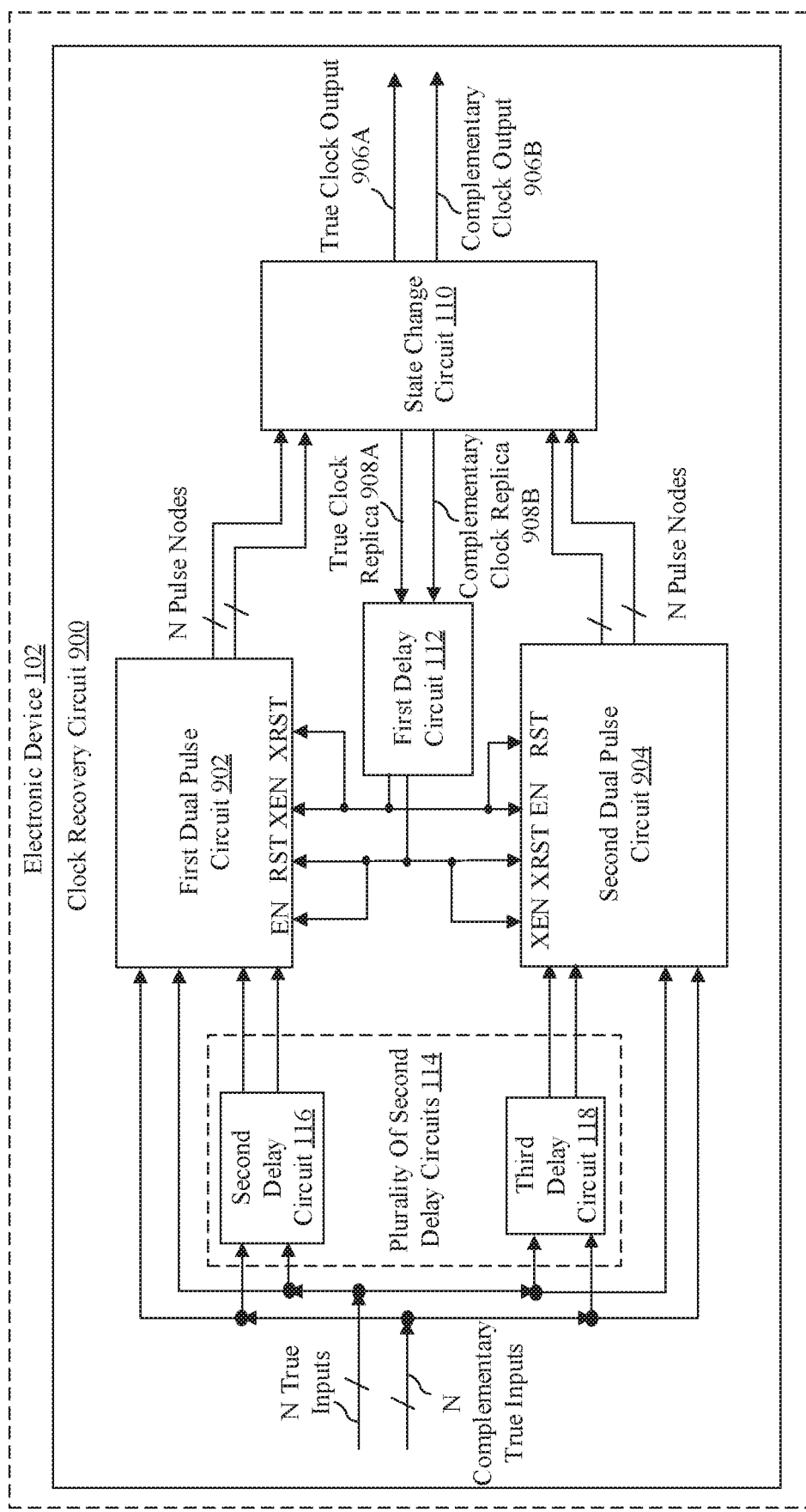
FIG. 9 is a schematic diagram of an exemplary electronic device including another clock recovery circuit including complementary outputs, in accordance with an embodiment of the disclosure.

FIG. 9 is a schematic diagram of an exemplary electronic device including another clock recovery circuit including complementary outputs, in accordance with an embodiment of the disclosure. FIG. 9 is explained in conjunction with elements from FIG. 1, FIG. 2A. FIG. 2B, FIG. 3, FIG. 4A, FIG. 4B, FIG. 5, FIG. 6, FIG. 7, and FIG. 8. With reference to FIG. 8, there is shown a clock recovery circuit 900 which may be similar to the clock recovery circuit 104 in FIG. 1 included in the electronic device 102. The clock recovery circuit 900 may generate the first clock signal at an output terminal 906A (referred as a "True clock Output) similar to the output terminal 110C in FIG. 1. In addition, the state change circuit 110 in FIG. 9 may generate another clock signal which may be complementary clock signal (referred as "Complementary clock output") provided at an output terminal 902B. The complementary clock signal (i.e. second clock signal) may be the complementary of the first clock signal.

Further, the clock recovery circuit 900 may include a first dual pulse circuit 902 and a second dual pulse circuit 904 similar to the first pulse circuit 106 and the second pulse circuit 108 described, for example, in FIG. 1. The first dual pulse circuit 902 may generate the first pulse signal (i.e. pullup pulse signal) and a complementary signal of the first pulse signal. Similarly, the second dual pulse circuit 904 may generate the second pulse signal (i.e. pulldown pulse signal) and a complementary signal of the second pulse signal, as shown in FIG. 9. Therefore, the state change circuit 110 in FIG. 9 may receive the first pulse signal and the complementary signal of the first pulse signal from the first dual pulse circuit 902, and may receive the second pulse signal and the complementary signal of the second pulse signal from the second dual pulse circuit 904 to further generate the first clock signal and the complementary clock, as shown in FIG. 9.

Further, in the clock recovery circuit 900, each of the first dual pulse circuit 902 and the second dual pulse circuit 904 may receive each of the plurality of data inputs and complementary input of each of the plurality of data inputs as shown in FIG. 9. Further, as described in FIGS. 1, 2A and 2B, each of the second delay circuit 116 and the third delay circuit 118 may receive the plurality of data inputs and the plurality of complementary data inputs to further provide the delayed inputs (i.e. actual input and complementary input) to the first dual pulse circuit 902 and the and the second dual pulse circuit 904, respectively.

In an embodiment, the first delay circuit 112 in FIG. 9, may receive the first clock signal ("True Clock Replica 908A") and the complementary of the first clock signal ("Complementary Clock Replica 908B) from the state change circuit 110 in FIG. 9. The first delay circuit 112 may further provide the delayed version of the first clock signal ("True Clock Replica 908A") and the complementary of the first clock signal ("Complementary Clock Replica 908B) as the control signals to each of the first dual pulse circuit 902 and the second dual pulse circuit 904 as shown in FIG. 9, to activate one of the first dual pulse circuit 902 and the second dual pulse circuit 904 at one U) and deactivate other pulse circuit in the same UI. The activation and the deactivation of the first dual pulse circuit 902 and the second dual pulse circuit 904 based on the control signals ("EN", "XEN", "RST", and "XRST") in different unit intervals, may provide detection of foremost transition of the plurality of data inputs and mask other transitions in the same UI as described, for example, in FIG. 5. In an embodiment, one or more key nodes/connections of the clock recovery circuit 900 may be coupled with the back-to-back holding inverters (in FIG. 8) such that the transitions of signals are roughly contemporaneous.

It may be noted that a timing diagram of the clock recovery circuit 900 may be similar to the timing diagram 500 described in the FIG. 5 for the clock recovery circuit 104. In addition, the timing diagram of the clock recovery circuit 900 may include complementary signals of various signals, for example, the plurality of data inputs, the first pulse signal 506, the second pulse signal 508, the first clock signal 510, and the delayed first clock signal 512. Therefore, the description of the timing diagram of the clock recovery circuit 900 is omitted from the disclosure of the sake of brevity.

Figure 10:
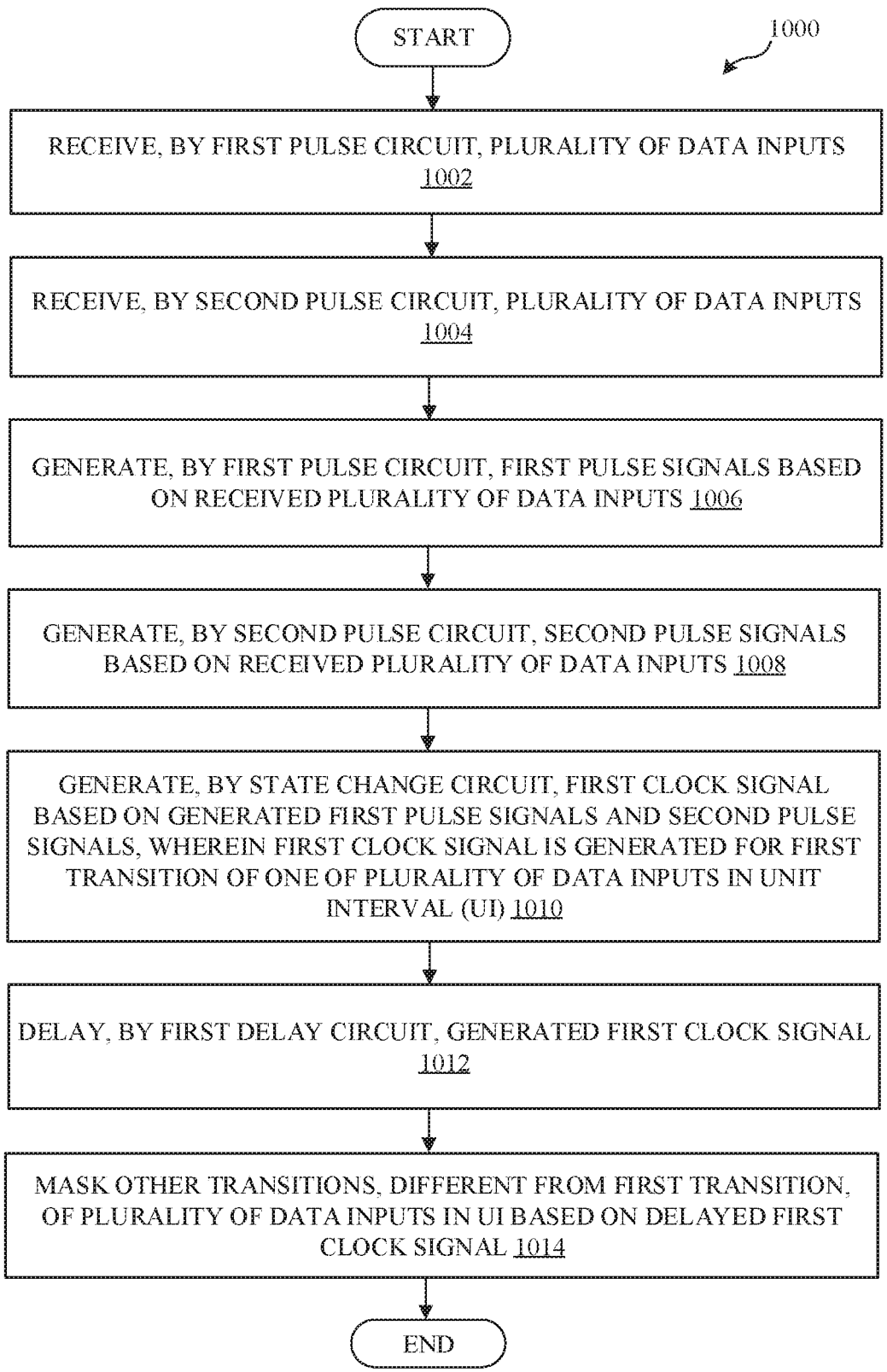
FIG. 10 illustrates an exemplary flow chart of a method for clock recovery, in accordance with an embodiment of the disclosure.

FIG. 10 illustrates an exemplary flow chart of a method for clock recovery, in accordance with an embodiment of the disclosure. FIG. 10 is described in conjunction with elements from FIGS. 1, 2A, 2B, 3, 4A, 4B, 5, 6, 7, 8, and 9. With reference to FIG. 10, there is shown a flowchart 1000. The operations of the flowchart 1000 may be executed by a computing system, such as the electronic device 102, or the clock recovery circuit 104. The operations may start at 1002 and proceed to 1014.

At 1002, the plurality of data inputs may be received by the first pulse circuit 106. In one or more embodiments, the first pulse circuit 106 of the clock recovery circuit 104 may be configured to receive the plurality of data inputs, via the first input terminal 106A, and the delayed plurality of data inputs, via the second input terminal 106B as described, for example, in FIGS. 1 and 2A.

At 1004, the plurality of data inputs may be received by the second pulse circuit 108. In one or more embodiments, the second pulse circuit 108 of the clock recovery circuit 104 may be configured to receive the plurality of data inputs, via the second input terminal 108B and the delayed plurality of data inputs, via the first input terminal 108A, as described, for example, in FIGS. 1 and 2B.

At 1006, the first pulse signals may be generated by the first pulse circuit 106 based on the received plurality of data inputs. In one or more embodiments, the first pulse circuit 106 (i.e. pullup pulse generator) may be configured to generate the first pulse signals for the plurality of data inputs as described, for example, in FIG. 2A.

At 1008, the second pulse signals may be generated by the second pulse circuit 108 based on the received plurality of data inputs. In one or more embodiments, the second pulse circuit 108 (i.e. pulldown generator circuit) may be configured to generate the second pulse signals for the plurality of data inputs as described, for example, in FIG. 2B.

At 1010, the first clock signal may be generated by the state change circuit 110 based on the generated first pulse signals and the second pulse signals. In one or more embodiments, the state change circuit 110 of the clock recovery circuit 104 may be configured to generate the first clock signal based on the first pulse signals and the second pulse signals received from the first pulse circuit 106 and the second pulse circuit 108 The first clock signal may be generated or recovered for the first transition of one of the plurality of data inputs in a unit interval (UI), described, for example, in FIGS. 3 and 5.

At 1012, the delay may be provided to the generated first clock signal by the first delay circuit 112. In one or more embodiments, first delay circuit 112 of the clock recovery circuit 104 may be configured to provide the controlled amount of delay to the generated first clock signal as described, for example, in FIGS. 4A, 4B, 6, and 7.

At 1014, the other transitions of the plurality of data inputs, (i.e. different from the first transition), may be masked in the UI, based on the delayed first clock signal. The masking of the other transitions of the plurality of data inputs in the UI, is described, for example in FIG. 5.

Although the flowchart 1000 is illustrated as discrete operations, such as 1002, 1004, 1006, 1008, 1010, 1012, and 1014 the disclosure is not so limited. Accordingly, in certain embodiments, such discrete operations may be further divided into additional operations, combined into fewer operations, or eliminated, depending on the particular implementation without detracting from the essence of the disclosed embodiments.

Exemplary aspects of the disclosure may include a clock recovery circuit (such as the clock recovery circuit 104). The clock recovery circuit 104 may be included in an electronic device (such as the electronic device 102). The clock recovery circuit 104 may include a first pulse circuit (such as the first pulse circuit 106) that may be configured to receive a plurality of data inputs to generate a first pulse signal. The clock recovery circuit 104 may include a second pulse circuit (such as the second pulse circuit 108) that may be configured to receive the plurality of data inputs to generate a second pulse signal. The clock recovery circuit may further include a state change circuit (such as the state change circuit 110) connected to the first pulse circuit 106 and the second pulse circuit 108. The state change circuit 110 may be configured to receive the first pulse signal and the second pulse signal and generate a first clock signal for a first transition of one of the plurality of data inputs in a first unit interval (UI), based on the generated first pulse signal and the second pulse signal. The clock recovery circuit 104 may further include a first delay circuit (such as the first delay circuit 112) connected to the state change circuit 110 and each of the first pulse circuit 106 and the second pulse circuit 108. The first delay circuit 112 may be configured to receive the generated first clock signal, and mask other transitions, different from the first transition, of the plurality of data inputs in the first UI.

In accordance with an embodiment, the state change circuit 110 may be further configured to activate one of the first pulse circuit 106 or the second pulse circuit 108 at a time, based on the generated first clock signal. In accordance with an embodiment, the first clock signal generated by the state change circuit 110 may indicate timing information associated with the plurality of data inputs received by the first pulse circuit 106 and the second pulse circuit 108. In accordance with an embodiment, the first pulse circuit 106 may include a pullup pulse generator circuit, and the second pulse circuit 108 may include a pulldown pulse generator circuit.

In accordance with an embodiment, the first pulse circuit 106 may include a plurality of N-type Metal-oxide semiconductor field-effect-transistor (MOSFET) edge detection switches 202, a N-type MOSFET enable switch 204, and a P-type MOSFET reset switch 206. In accordance with an embodiment, an output terminal (such as the output terminal 112B) of the first delay circuit 112 may be connected to the N-type MOSFET enable switch 204 and the P-type MOSFET reset switch 206 of the first pulse circuit 106, to mask the other transitions of the plurality of data inputs in the first UI. In accordance with an embodiment, the state change circuit 110 may be connected to the N-type MOSFET edge detection switches 202 and the P-type MOSFET reset switch 206 of the first pulse circuit 106, to receive the first pulse signal.

In accordance with an embodiment, the second pulse circuit 108 may include a plurality of P-type Metal-oxide semiconductor field-effect-transistor (MOSFET) edge detection switches 218, a P-type MOSFET enable switch 220, and a N-type MOSFET reset switch 222. In accordance with an embodiment, the P-type MOSFET edge detection switches 218 may be configured to implement an exclusive OR (EX-OR) operation for generation of the second pulse signal to drive the state change circuit 110.

In accordance with an embodiment, an output terminal (such as the output terminal 112B) of the first delay circuit 112 may be connected to the P-type MOSFET enable switch 220 and the N-type MOSFET reset switch 222 of the second pulse circuit 108, to mask the other transitions of the plurality of data inputs in the first UI.

In accordance with an embodiment, the state change circuit 110 may be connected to the P-type MOSFET edge detection switches 218 and the N-type MOSFET reset switch 222 of the second pulse circuit 108, to receive the second pulse signal. In accordance with an embodiment, the state change circuit 110 may include a first plurality of P-type MOSFET switches (such as the first plurality of P-type MOSFET switches 302) connected with the plurality of N-type MOSFET edge detection switches 202 of the first pulse circuit 106, and further includes a second plurality of N-type MOSFET switches (such as the second plurality of N-type MOSFET switches 304) connected with the plurality of P-type MOSFET edge detection switches 218 of the second pulse circuit 108.

In accordance with an embodiment, an input terminal (such as the input terminal 112A) of the first delay circuit 112 may be connected to a drain terminal of each of the first plurality of P-type MOSFET switches 302 and each of the second plurality of N-type MOSFET switches 304 of the state change circuit 110. In accordance with an embodiment, the first delay circuit 112 may be configured to generate a variable delay to mask the other transitions of the plurality of data inputs in the first UI. In accordance with an embodiment, the first delay circuit 112 may include an inverter circuit, as a buffer circuit, to generate the variable delay.

In accordance with an embodiment, the first delay circuit 112 may further include a plurality of fixed capacitors connected to an output terminal of the inverter circuit, to generate the variable delay. In accordance with an embodiment, the first delay circuit 112 may further include a variable capacitor (such as the variable capacitor 702) connected to an output terminal of the inverter circuit, to generate the variable delay in the first clock signal.

In accordance with an embodiment, the clock recovery circuit 104 may further include a plurality of second delay circuits (such as the plurality of second delay circuits 114). The first pulse circuit 106 and the second pulse circuit 108 may be configured to receive the plurality of data inputs, via the plurality of second delay circuits 114. In accordance with an embodiment, the state change circuit 110 may be further configured to generate a second clock signal complementary to the first clock signal based on the received first pulse signal and the received second pulse signal.

The present disclosure may be realized in hardware, or a combination of hardware and software. The present disclosure may be realized in a centralized fashion, in at least one computer system, or in a distributed fashion, where different elements may be spread across several interconnected computer systems. A computer system or other apparatus adapted for carrying out the methods described herein may be suited. A combination of hardware and software may be a general-purpose computer system with a computer program that, when loaded and executed, may control the computer system such that it carries out the methods described herein. The present disclosure may be realized in hardware that comprises a portion of an integrated circuit that also performs other functions.

The present disclosure may also be embedded in a computer program product, which comprises all the features enabling the implementation of the methods described herein, and which when loaded in a computer system is able to carry out these methods. Computer program, in the present context, means any expression, in any language, code or notation, of a set of instructions intended to cause a system having an information processing capability to perform a particular function either directly, or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A clock recovery circuit, comprising:
    a first pulse circuit configured to receive a plurality of data inputs to generate a first pulse signal;
    a second pulse circuit configured to receive the plurality of data inputs to generate a second pulse signal;
    a state change circuit connected to the first pulse circuit and the second pulse circuit, wherein the state change circuit is configured to
        receive the first pulse signal and the second pulse signal, and
        generate a first clock signal for a first transition of one of the plurality of data inputs in a first unit interval (UI), based on the generated first pulse signal and the second pulse signal; and
    a first delay circuit connected to the state change circuit and each of the first pulse circuit and the second pulse circuit, wherein the first delay circuit is configured to
        receive the generated first clock signal, and
        mask other transitions, different from the first transition, of the plurality of data inputs in the first UI.

2. The clock recovery circuit according to claim 1, wherein the state change circuit is further configured to activate one of the first pulse circuit or the second pulse circuit in the first UI, based on the generated first clock signal.

3. The clock recovery circuit according to claim 1, wherein the first clock signal generated by the state change circuit indicates timing information associated with the plurality of data inputs received by the first pulse circuit and the second pulse circuit.

4. The clock recovery circuit according to claim 1, wherein the first pulse circuit comprises a pullup pulse generator circuit, and the second pulse circuit comprises a pulldown pulse generator circuit.

5. The clock recovery circuit according to claim 1, wherein the first pulse circuit includes a plurality of N-type Metal-oxide semiconductor field-effect-transistor (MOSFET) edge detection switches, a N-type MOSFET enable switch, and a P-type MOSFET reset switch.

6. The clock recovery circuit according to claim 5, wherein an output terminal of the first delay circuit is connected to the N-type MOSFET enable switch and the P-type MOSFET reset switch of the first pulse circuit, to mask the other transitions of the plurality of data inputs in the first UI.

7. The clock recovery circuit according to claim 5, wherein the state change circuit is connected to the N-type MOSFET edge detection switches and the P-type MOSFET reset switch of the first pulse circuit, to receive the first pulse signal.

8. The clock recovery circuit according to claim 1, wherein the second pulse circuit includes a plurality of P-type Metal-oxide semiconductor field-effect-transistor (MOSFET) edge detection switches, a P-type MOSFET enable switch, and a N-type MOSFET reset switch.

9. The clock recovery circuit according to claim 8, wherein the P-type MOSFET edge detection switches are configured to implement an exclusive OR (EX-OR) operation for generation of the second pulse signal to drive the state change circuit.

10. The clock recovery circuit according to claim 8, wherein an output terminal of the first delay circuit is connected to the P-type MOSFET enable switch and the N-type MOSFET reset switch of the second pulse circuit, to mask the other transitions of the plurality of data inputs in the first UI.

11. The clock recovery circuit according to claim 8, wherein the state change circuit is connected to the P-type MOSFET edge detection switches and the N-type MOSFET reset switch of the second pulse circuit, to receive the second pulse signal.

12. The clock recovery circuit according to claim 1, wherein the state change circuit includes a first plurality of P-type MOSFET switches connected with a plurality of N-type MOSFET edge detection switches of the first pulse circuit, and further includes a second plurality of N-type MOSFET switches connected with a plurality of P-type MOSFET edge detection switches of the second pulse circuit.

13. The clock recovery circuit according to claim 12, wherein an input terminal of the first delay circuit is connected to a drain terminal of each of the first plurality of P-type MOSFET switches and each of the second plurality of N-type MOSFET switches of the state change circuit.

14. The clock recovery circuit according to claim 1, wherein the first delay circuit is configured to generate a variable delay to mask the other transitions of the plurality of data inputs in the first UI.

15. The clock recovery circuit according to claim 14, wherein the first delay circuit includes an inverter circuit, as a buffer circuit, to generate the variable delay.

16. The clock recovery circuit according to claim 15, wherein the first delay circuit further includes a plurality of fixed capacitors connected to an output terminal of the inverter circuit, to generate the variable delay.

17. The clock recovery circuit according to claim 15, wherein the first delay circuit further includes a variable capacitor connected to an output terminal of the inverter circuit, to generate the variable delay in the first clock signal.

18. The clock recovery circuit according to claim 1, further comprising a plurality of second delay circuits, wherein the first pulse circuit and the second pulse circuit are configured to receive the plurality of data inputs, via the plurality of second delay circuits.

19. The clock recovery circuit according to claim 1, wherein the state change circuit is further configured to generate second clock signal complementary to the first clock signal based on the received first pulse signal and the received second pulse signal.

20. An electronic device, comprising:
a clock recovery circuit which includes:
    a first pulse circuit configured to receive a plurality of data inputs to generate a first pulse signal;
    a second pulse circuit configured to receive the plurality of data inputs to generate a second pulse signal;
    a state change circuit connected to the first pulse circuit and the second pulse circuit, wherein the state change circuit is configured to:
        receive the first pulse signal and the second pulse signal, and
        generate a first clock signal for a first transition of one of the plurality of data inputs in a first unit interval (UI), based on the generated first pulse signal and the second pulse signal; and
    a first delay circuit connected to the state change circuit and each of the first pulse circuit and the second pulse circuit, wherein the first delay circuit is configured to:
        receive the generated first clock signal, and
        mask other transitions, different from the first transition, of the plurality of data inputs in the first UI.

21. A method, comprising:
in a clock recovery circuit:
receiving, via a first pulse circuit, a plurality of data inputs to generate a first pulse signal;
receiving, via a second pulse circuit, the plurality of data inputs to generate a second pulse signal;
generating, by a state change circuit connected to the first pulse circuit and the second pulse circuit, a first clock signal for a first transition of one of the plurality of data inputs in a first unit interval (UI) based on the first pulse signal and the second pulse signal; and
receiving, by a first delay circuit connected to the state change circuit and each of the first pulse circuit and the second pulse circuit, the generated first clock signal to mask other transitions, different from the first transition, of the plurality of data inputs in the first UI.

* * * * *